(12) United States Patent
Wang et al.

(10) Patent No.: US 11,841,577 B2
(45) Date of Patent: Dec. 12, 2023

(54) BACKLIGHT MODULE AND DISPLAY DEVICE

(71) Applicants: Beijing BOE Optoelectronics Technology Co., Ltd., Beijing (CN); BOE Technology Group Co., Ltd., Beijing (CN)

(72) Inventors: Zhiyong Wang, Beijing (CN); Yong Song, Beijing (CN); Lingyun Shi, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/788,135

(22) PCT Filed: Aug. 4, 2021

(86) PCT No.: PCT/CN2021/110590
§ 371 (c)(1),
(2) Date: Jun. 22, 2022

(87) PCT Pub. No.: WO2022/068380
PCT Pub. Date: Apr. 7, 2022

(65) Prior Publication Data
US 2023/0031334 A1  Feb. 2, 2023

(30) Foreign Application Priority Data

Sep. 30, 2020  (CN) .......................... 202011069930.4

(51) Int. Cl.
*G02F 1/00*  (2006.01)
*G02F 1/13357*  (2006.01)
*G02F 1/1335*  (2006.01)

(52) U.S. Cl.
CPC .. *G02F 1/133603* (2013.01); *G02F 1/133612* (2021.01)

(58) Field of Classification Search
CPC ..................... G02F 1/133603; G02F 1/133612
See application file for complete search history.

(56) References Cited

U.S. PATENT DOCUMENTS

2008/0061701 A1  3/2008  Lee et al.
2019/0114459 A1  4/2019  Ma et al.
(Continued)

FOREIGN PATENT DOCUMENTS

CN   106814498 A   6/2017
CN   108922469 A   11/2018
(Continued)

*Primary Examiner* — Gerald J Sufleta, II
(74) *Attorney, Agent, or Firm* — WHDA, LLP

(57) ABSTRACT

A backlight module includes: a plurality of lamp groups arranged in an array on a base substrate, each lamp group comprises a plurality of mini light emitting diodes, a plurality of lead wires in the lamp group, an external anode and an external cathode; a plurality of anode wires and cathode wires electrically connected to external anodes and external cathodes of a plurality of rows of lamp groups, respectively, wherein in at least some of the plurality of cathode wires, one same cathode wire is electrically connected to the external cathodes of the lamp groups located in different rows. Same-type anode wires comprise a plurality of anode wires to which same-wire lamp groups are connected, and orthographic projections of the same-type anode wires on the base substrate do not overlap with an orthographic projection of one same lead wire in the lamp group on the base substrate.

12 Claims, 20 Drawing Sheets

(56) References Cited

U.S. PATENT DOCUMENTS

| | | | |
|---|---|---|---|
| 2020/0035147 A1* | 1/2020 | Ban | G09G 3/32 |
| 2021/0296548 A1* | 9/2021 | Hayashi | H01L 25/0753 |
| 2022/0263000 A1* | 8/2022 | Yang | H01L 25/0753 |

FOREIGN PATENT DOCUMENTS

| | | |
|---|---|---|
| CN | 109031779 A | 12/2018 |
| CN | 109343275 A | 2/2019 |
| CN | 211375271 U | 8/2020 |

* cited by examiner

BACKLIGHT MODULE AND DISPLAY DEVICE

CROSS-REFERENCE TO RELATED APPLICATIONS

This application is a Section 371 National Stage Application of International Application No. PCT/CN2021/110590 filed on Aug. 4, 2021, which claims benefit of Chinese Patent Application No. 202011069930.4 filed on Sep. 30, 2020 in the State Intellectual Property Office of China, the disclosure of which is hereby incorporated in its entirety by reference.

TECHNICAL FIELD

The present disclosure relates to a field of display technology, and in particular, to a backlight module and a display device.

BACKGROUND

Light Emitting Diode (LED) technology has been developed for nearly 30 years, and its application range has been expanded continuously. For example, the light emitting diode may be applied in a display field as a backlight of a display device or as an LED display screen. With a development of technology, Mini Light Emitting Diode (Mini LED) has gradually become a research hotspot in the field of display technology. For example, the Mini LED may be used in a backlight module of a liquid crystal display device as a light emitting element of the backlight module. In this way, by utilizing advantages of the Mini LED, the backlight module may achieve advantages of divisional dimming, fast response, simple structure, long service life, and the like.

The above information disclosed in this section is only for an understanding of the background of the inventive concept of the present disclosure. Therefore, the above information may contain information that does not constitute the prior art.

SUMMARY

In an aspect, a backlight module is provided, including:
a base substrate;
a plurality of light zones arranged on the base substrate, wherein the plurality of light zones are arranged in an array on the base substrate, each light zone includes a plurality of mini light emitting diodes, a plurality of lead wires in the light zone, an external anode and an external cathode, and the plurality of lead wires in the light zone are configured to electrically connect the plurality of mini light emitting diodes in series;
a plurality of anode wires respectively electrically connected to external anodes of a plurality of rows of light zones; and
a plurality of cathode wires respectively electrically connected to external cathodes of a plurality of rows of light zones,
wherein in at least some of the plurality of cathode wires, one same cathode wire is electrically connected to the external cathodes of the light zones located in different rows to provide, by means of time-division multiplexing, cathode signals to the light zones located in different rows; and
same-wire light zones include a plurality of light zones electrically connected to one same cathode wire, same-type anode wires include a plurality of anode wires to which the same-wire light zones are connected, and orthographic projections of the same-type anode wires on the base substrate do not overlap with an orthographic projection of one same lead wire in any of the plurality of light zones on the base substrate.

According to some exemplary embodiments of the present disclosure, the plurality of cathode wires are arranged at intervals, the base substrate includes a plurality of regions, and any two adjacent regions in the plurality of regions are spaced apart by an orthographic projection of at least one cathode wire on the base substrate; the orthographic projections of the same-type anode wires on the base substrate are located in different regions of the plurality of regions, respectively.

According to some exemplary embodiments of the present disclosure, the plurality of anode wires include a plurality of groups of anode wires, and orthographic projections of a plurality of anode wires in each group of anode wires on the base substrate fall within one same region of the plurality of regions; a plurality of light zones to which each group of anode wires is connected are electrically connected to different cathode wires, respectively.

According to some exemplary embodiments of the present disclosure, the plurality of light zones are arranged in an array of m rows and n columns on the base substrate; a number of the plurality of cathode wires is M, a number of the plurality of anode wires is m, a number of the plurality of groups of anode wires is N, where m, n, and M are positive integers greater than or equal to 2, m is more than 2 times of M, and N is a rounded up value obtained by dividing m by M.

According to some exemplary embodiments of the present disclosure, a number of the plurality of regions is N, and the N groups of anode wires are located in the N regions, respectively.

According to some exemplary embodiments of the present disclosure, the N groups of anode wires at least include a first group of anode wires, a second group of anode wires, and a third group of anode wires, and the N regions at least include a first region, a second region and a third region, orthographic projections of the first group of anode wires, the second group of anode wires and the third group of anode wires on the base substrate fall within the first region, the second region and the third region, respectively, and orthographic projections of the first group of anode wires on the base substrate do not overlap with orthographic projections of the lead wires in any of the plurality of light zones on the base substrate.

According to some exemplary embodiments of the present disclosure, orthographic projections of the second group of anode wires on the base substrate overlap with orthographic projections of some of the plurality of lead wires in the light zone on the base substrate, orthographic projections of the third group of anode wires on the base substrate overlap with orthographic projections of some others of the plurality of lead wires in the light zone on the base substrate.

According to some exemplary embodiments of the present disclosure, the anode wires and the cathode wires extend along a first direction, some of the plurality of lead wires in the light zone extend in the first direction, some others of the plurality of lead wires in the light zone extend in a second direction, and the second direction intersects with the first direction.

According to some exemplary embodiments of the present disclosure, the plurality of cathode wires are divided into N–1 groups, and the N–1 groups of cathode wires are arranged equidistantly on the base substrate at intervals.

According to some exemplary embodiments of the present disclosure, a width of each of the plurality of lead wires in the light zone is larger than a width of each of the plurality of anode wires and the plurality of cathode wires.

In another aspect, a backlight module is provided, including:

a base substrate;

a plurality of light zones arranged on the base substrate, wherein the plurality of light zones are arranged in an array on the base substrate, and each light zone includes a plurality of mini light emitting diodes, a plurality of lead wires in the light zone, an external anode and an external cathode, and the plurality of lead wires in the light zone are configured to electrically connect the plurality of mini light emitting diodes in series;

a plurality of anode wires respectively electrically connected to external anodes of a plurality of rows of light zones; and a plurality of cathode wires respectively electrically connected to external cathodes of a plurality of rows of light zones, wherein in at least some of the plurality of cathode wires, one same cathode wire is electrically connected to the external cathodes of light zones located in different rows to provide, by means of time-division multiplexing, cathode signals to the light zones located in different rows; and same-wire light zones include a plurality of light zones electrically connected to one same cathode wire, same-type anode wires include a plurality of anode wires to which the same-wire light zones are connected, orthographic projections of the same-type anode wires on the base substrate partially overlap with an orthographic projection of one same lead wires in the light zone on the base substrate, and the partial overlap enables a parasitic capacitance voltage generated on the same-type anode wires to be smaller than a threshold voltage of the light zone.

In yet another aspect, a display device is provided, including the backlight module as described above.

BRIEF DESCRIPTION OF DRAWINGS

Other objectives and advantages of the present disclosure will be apparent through the following descriptions of the present disclosure with reference to the accompanying drawings, which may facilitate a comprehensive understanding of the present disclosure.

Figure 1:
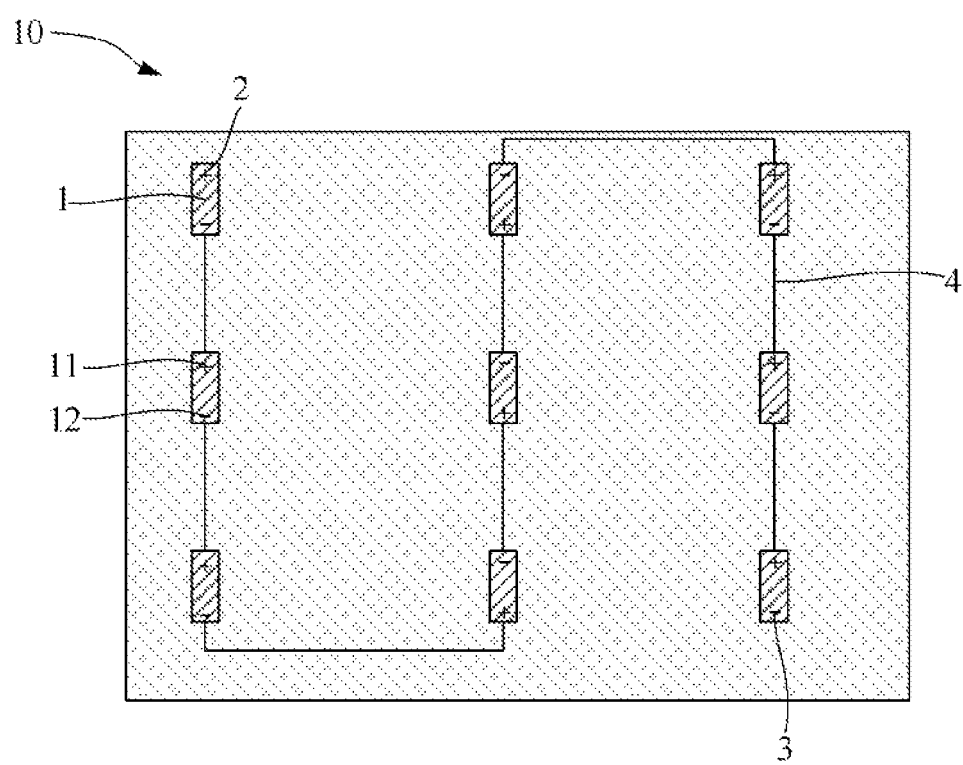
FIG. 1 is a schematic plan view of a light zone according to some exemplary embodiments of the present disclosure.

It should be noted that, for clarity, sizes of layers, structures or regions in the accompanying drawings used to describe the embodiments of the present disclosure may be exaggerated or reduced, i.e., the accompanying drawings are not drawn to actual scale.

DETAILED DESCRIPTION

In the following descriptions, for purposes of explanation, numerous specific details are set forth in order to provide a comprehensive understanding of various exemplary embodiments. However, it is obvious that the various exemplary embodiments may be implemented without these specific details or with one or more equivalent arrangements. In other instances, well-known structures and devices are shown in block diagram form in order to avoid unnecessarily obscuring the various exemplary embodiments. Moreover, the various exemplary embodiments may be different, but are not necessarily exclusive. For example, particular shapes, configurations and characteristics of an exemplary embodiment may be used or implemented in another exemplary embodiment without departing from the inventive concept.

In the drawings, sizes and relative sizes of elements may be exaggerated for clarity and/or purpose of description. As such, the sizes and relative sizes of each element are not necessarily limited to those shown in the drawings. While exemplary embodiments may be implemented differently, a specific process sequence may be performed differently from a described sequence. For example, two consecutively described processes may be performed substantially simultaneously or in an order reverse to the order described. In addition, the same reference numerals indicate the same elements.

When an element is described as being "on", "connected to" or "coupled to" another element, the element may be directly on, connected or coupled to the another element or an intervening element may be present. However, when an element is described as being "directly on", "directly connected to" or "directly coupled to" another element, there is no intervening element. Other terms and/or expressions used to describe a relationship between elements should be interpreted in a similar manner, such as, "between . . . and" versus "directly between . . . and", "adjacent" versus "directly adjacent" or "on" versus "directly on", etc. Moreover, the term "connection" may refer to a physical connection, an electrical connection, a communication connection, and/or a fluid connection. Furthermore, X, Y, and Z axes are not limited to three axes of a rectangular coordinate system, and may be interpreted in a broader sense. For example, X, Y, and Z axes may be perpendicular to each other, or may represent different directions that are not perpendicular to each other. For purposes of the present disclosure, "at least one of X, Y and Z" and "at least one selected from a group consisting of X, Y and Z" may be interpreted as X only, Y only, Z only, or any combination of two or more of X, Y and Z, such as XYZ, XY, YZ and XZ. As used herein, the term "and/or" includes any and all combinations of one or more of related items listed.

It should be understood that, although the terms first, second, etc. may be used here to describe various elements, these elements should not be limited by these terms. These terms are only used to distinguish one element from another. For example, without departing from the scope of exemplary embodiments, a first element could be referred as a second element, and, similarly, a second element could be referred a first element.

Herein, expressions "wiring", "wire", "lead wire" and the like may include a conductive wire formed of a conductive material, which is usually an opaque material, such as a metal conductive material such as Cu.

Herein, an inorganic light emitting diode refers to a light emitting element made of an inorganic material, wherein LED means an inorganic light emitting element different from OLED. Specifically, the inorganic light emitting element may include a mini light emitting diode (Mini LED) and a micro light emitting diode (Micro LED). The mini light emitting diode (i.e., Mini LED) refers to a small light emitting diode with a grain size between the Micro LED and a traditional LED. Generally, a grain size of the Mini LED may be between 100 and 300 microns.

A plurality of Mini LEDs are arranged in an array, every N Mini LEDs form a region, and brightness of different regions may be controlled by an integrated circuit. When the plurality of Mini LEDs arranged in an array are used as a backlight module of a passive display panel, a picture contrast of a liquid crystal display device, for example, may be significantly improved, thereby improving a picture quality.

The Mini LED backlight module includes a plurality of mini LEDs arranged in an array. The plurality of mini LEDs are divided into a plurality of light zones. FIG. 1 is a schematic plan view of a light zone according to some exemplary embodiments of the present disclosure. As shown in FIG. 1, a light zone 10 may include a plurality of mini LEDs 1. For example, in the embodiment shown in FIG. 1, one light zone 10 includes 9 mini LEDs 1, and the 9 mini LEDs 1 are arranged in an array of 3 rows and 3 columns. It should be noted that the number and the array arrangement here are only exemplary, and the embodiments of the present disclosure are not limited this. In other embodiments, one light zone 10 may include a smaller number or a larger number of mini LEDs 1. Moreover, a connection mode of the plurality of mini LEDs 1 included in the one light zone 10 may also be in other forms. In addition, the plurality of mini LEDs 1 may also be arranged in an array in other ways.

Continuing to refer to FIG. 1, each mini LED 1 may include a positive electrode 11 and a negative electrode 12. In the embodiment shown in FIG. 1, nine mini LEDs 1 may be sequentially electrically connected in series. For example, a negative electrode 12 of a previous mini LED 1 is electrically connected to a positive electrode 11 of a latter mini LED 1 through a lead wire, a positive electrode 11 of a head mini LED 1 is electrically connected to an anode wire, and a negative electrode 11 of a tail mini LED 1 is electrically connected to a cathode wire.

In the present disclosure, for ease of description, an anode in a light zone electrically connected to the anode wire is referred as an external anode, which is denoted by reference numeral 2; a cathode in a light zone electrically connected to the cathode wire is referred as an external cathode, which is denoted by reference numeral 3; lead wires in a light zone for electrically connect each mini LED in series are referred as lead wires in the light zone, which are denoted by reference numerals 4.

Thus, in the present disclosure, unless otherwise specified, the expression "light zone" refers to a light emitting unit formed by a plurality of mini LEDs connected electrically in series, and one light zone may include: a plurality of mini LEDs 1, a plurality of lead wires 4 configured to electrically connect a plurality of mini LEDs in series, an external anode 2, and an external cathode 3.

For example, one light zone may include a plurality of mini LEDs arranged in a p*q matrix, wherein p and q are both natural numbers greater than or equal to 2. For example, in the embodiment shown in FIG. 1, p=3, and q=3. In other embodiments, p may not be equal to q.

One light zone includes (p*q−1) lead wires 4 in the light zone. For example, in the embodiment shown in FIG. 1, one light zone includes eight lead wires 4 in the light zone, which are used to electrically connect the nine mini LEDs in series.

In the present disclosure, unless otherwise specified, the expression "anode wire" refers to a signal wire for transmitting an anode voltage signal to the external anode of the light zone; the expression "cathode wire" refers to a signal wire for transmitting a cathode voltage signal (e.g., GND signal) to the external cathode of the light zone.

It should be noted that a rectangular frame is used to represent the mini LED in FIG. 1, but it may be understood that the mini LED in the embodiments of the present disclosure is not limited to a rectangle, and may have other shapes such as a circle, a polygon or other shapes.

Figure 2:
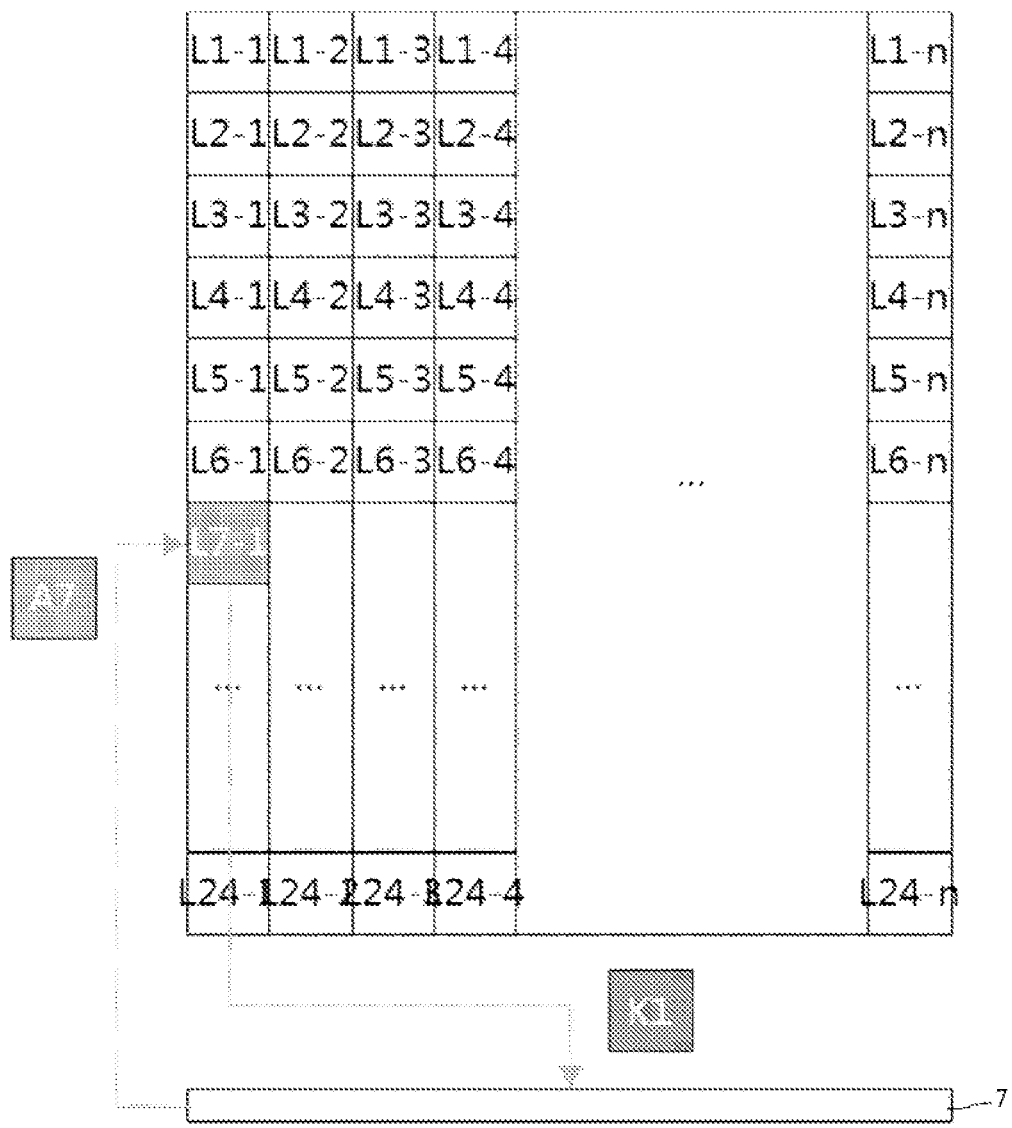
FIG. 2 is a schematic diagram of a backlight module according to some exemplary embodiments of the present disclosure, wherein an array arrangement of light zones in the backlight module is schematically shown.

FIG. 2 is a schematic diagram of a backlight module according to some exemplary embodiments of the present disclosure, wherein an array arrangement of light zones in the backlight module is schematically shown. As shown in FIG. 2, the backlight module may include a plurality of light zones 10. The plurality of light zones 10 may be arranged on a base substrate SUB in a matrix of m*n, i.e., arranged on the base substrate SUB in a matrix of m rows and n columns. For example, the base substrate SUB may be a glass substrate. A Mini LED backlight product based on the glass substrate has advantages of low cost, large-scale production, large size and the like.

An external anode 2 and an external cathode 3 of each light zone 10 are electrically connected to an anode wire A and a cathode wire K, respectively. FIG. 2 only shows an anode wire A7 and a cathode wire K1. For example, the backlight module may further include an integrated circuit 7. One end of the anode wire A is electrically connected to the integrated circuit 7, and the other end of the anode wire A is electrically connected to the external anode 2 of the light zone 10. One end of the cathode wire K is electrically connected to the external cathode 3 of the light zone 10, and the other end of the cathode wire K is electrically connected to the integrated circuit 7. In this way, an anode signal and a cathode signal output by the integrated circuit 7 may be respectively transmitted to the external anode 2 and external cathode 3 of the light zone 10, such that a light emission of the light zone 10 may be controlled.

As shown in FIG. 2, an electrical connection between the light zone 10 located in the 7th row and the 1st column and the integrated circuit 7 is schematically shown. For example, the light zone 10 located in the 7th row and the 1st column may be electrically connected to the integrated circuit 7 through the anode wire A7 (i.e., the seventh anode wire) and the cathode wire K1 (i.e., the first cathode wire).

In the Mini LED backlight module, the number of light zones 10 is relatively large. In the embodiments of the present disclosure, a method of time-division multiplexing of cathode wire may be used to reduce the number of cathode wires, thereby reducing a difficulty of arranging wiring. That is, one cathode wire may be electrically connected to a plurality of rows of light zones 10, and cathode signals may be provided to the plurality of rows of light zones 10 by means of time-division multiplexing.

Figure 3:
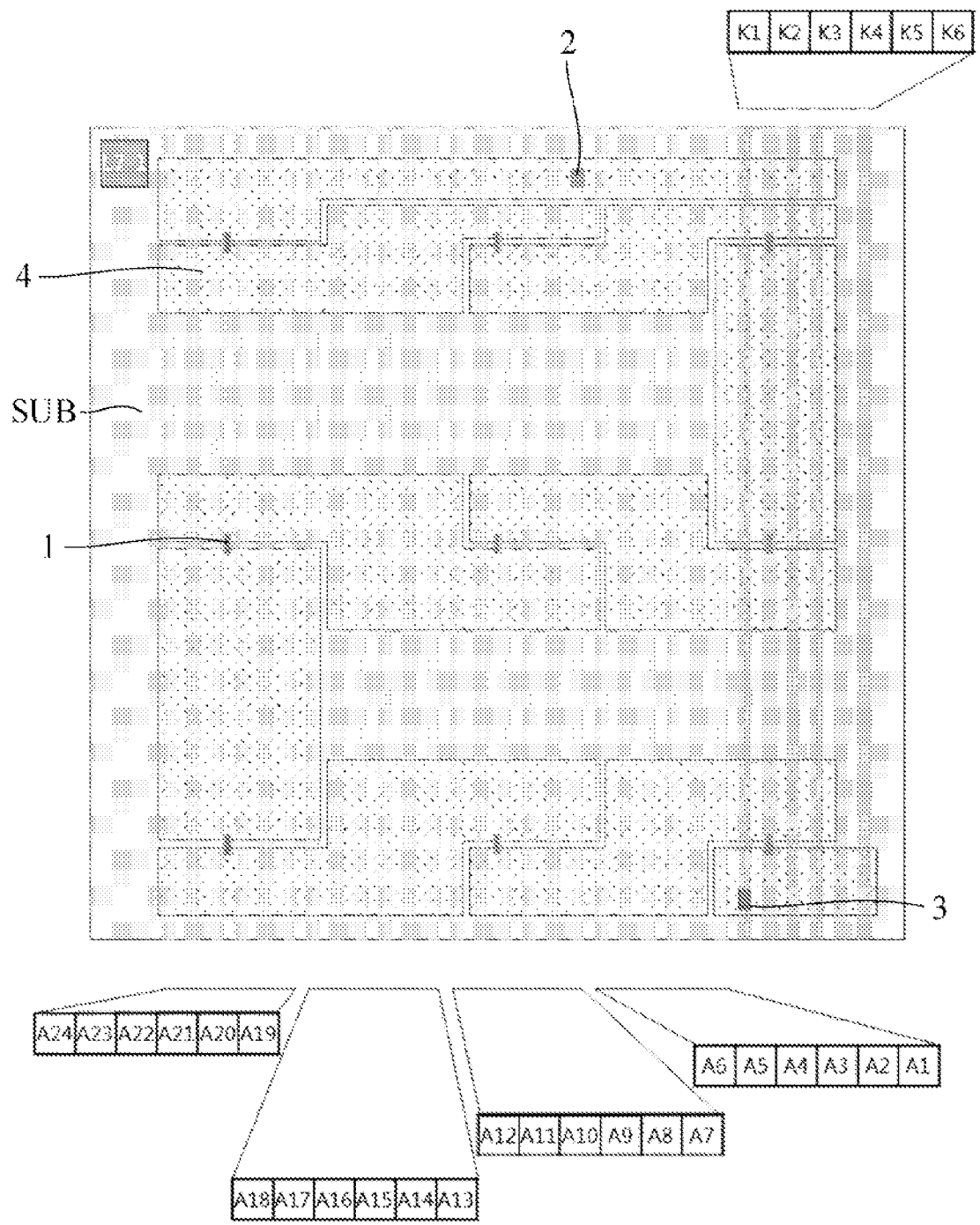
FIG. 3 is a partial enlarged view of a backlight module according to some exemplary embodiments of the present disclosure, wherein a positional relationship of a light zone, anode wires and cathode wires is schematically shown.
Figure 4:
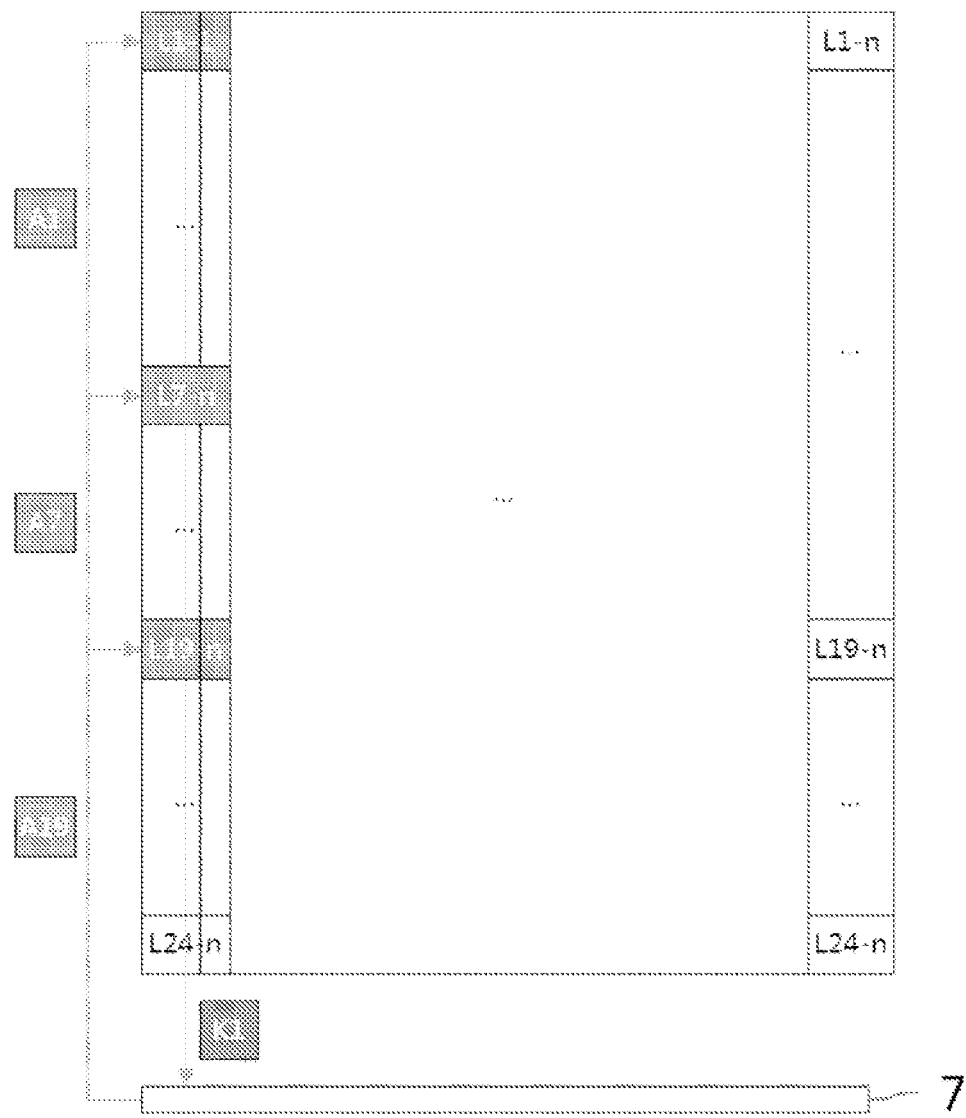
FIG. 4 schematically shows a connection of same-wire light zones with anode wires and cathode wires.

FIG. 3 is a partial enlarged view of a backlight module according to some exemplary embodiments of the present disclosure, wherein a positional relationship of a light zone, anode wires and cathode wires is schematically shown. FIG. 4 schematically shows a connection of same-wire light zones with anode wires and cathode wires. In the embodiments of the present disclosure, the plurality of light zones 10 in FIG. 2 may be grouped. For example, in the embodiment of FIG. 2, m rows of light zones 10 are provided; considering a driving capability of the integrated circuit 7, the number of cathode wires that the integrated circuit 7 may provide is M. In this case, the m rows of light zones 10 may be divided into N groups, and N is a rounded up value obtained by dividing m by M.

For example, in the embodiment of FIG. 2, 24 rows of light zones 10 are provided, that is, m=24; the number of cathode wires that the integrated circuit 7 may provide is 6, that is, M=6. In this way, the 24 rows of light zones 10 may be divided into 4 (24/6) groups.

As shown in FIG. 3, 6 cathode wires are provided, which are denoted as K1, K2, K3, K4, K5 and K6, respectively; and 24 anode wires are provided, which are denoted as A1 to A24, respectively. In the embodiment of FIG. 3, the 6 cathode wires are centrally arranged on a side of the base substrate. The embodiments of the present disclosure are not limited to this, and the 6 cathode wires may also be uniformly distributed on the base substrate.

For example, 4 rows of light zones distributed equidistantly in a column direction may be connected to one cathode wire simultaneously. As shown in FIG. 3, light zones L1, L7, L13 and L19 are connected to the same cathode wire K1. The light zones L1, L7, L13, and L19 respectively represent the light zones 10 on the 1st, 7th, 13th, and 19th rows. By such analogy, light zones L2, L8, L14, and L20 are connected to the same cathode wire K2.

External cathodes of light zones L1 to L6 are respectively electrically connected to cathode wires K1 to K6. By such analogy, external cathodes of light zones L7 to L12 are respectively electrically connected to the cathode wires K1 to K6.

Light zones L1 to L24 are respectively electrically connected to the anode wires A1 to A24, that is, the anode wires are not multiplexed.

In the present disclosure, for ease of description, a plurality of light zones (or a plurality of rows of light zones) electrically connected to one same cathode wire are referred as "same-wire light zones", and anode wires to which each light zone in the "same-wire light zone" is connected to are referred to as "same-type anode wires". That is, the expression "same-wire light zones" refers to a plurality of light zones (or a plurality of rows of light zones) electrically connected to one same cathode wire, and the expression "same-type anode wires" refers to a plurality of anode wires to which a plurality of light zones (or a plurality of rows of light zones) electrically connected to the same cathode wire are connected. The expression "same-group anode wires" refers to a plurality of anode wires located in one same region, and the light zones to which these anode wires are connected are electrically connected to different cathode wires. For example, referring to FIG. 2 and FIG. 3, the light zones L1, L7, L13 and L19 may be referred to as the "same-wire light zones", the anode wires A1, A7, A13 and A19 may be referred to as the "same-type anode wires", and the anode wires A1 to A6 may be referred to as the "same-group anode wires".

Figure 5:
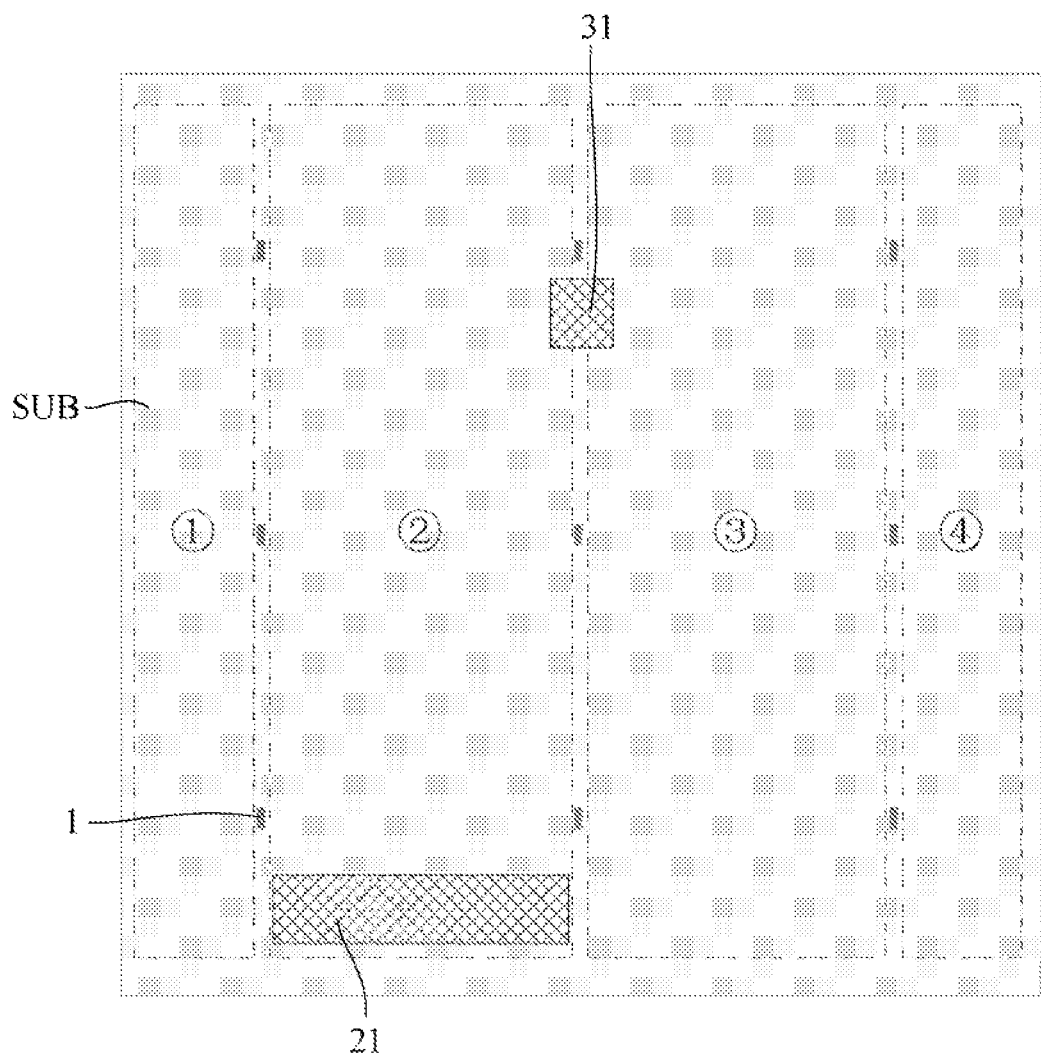
FIG. 5 is a schematic diagram of a plurality of regions of a base substrate included in a backlight module according to some exemplary embodiments of the present disclosure.
Figure 6:
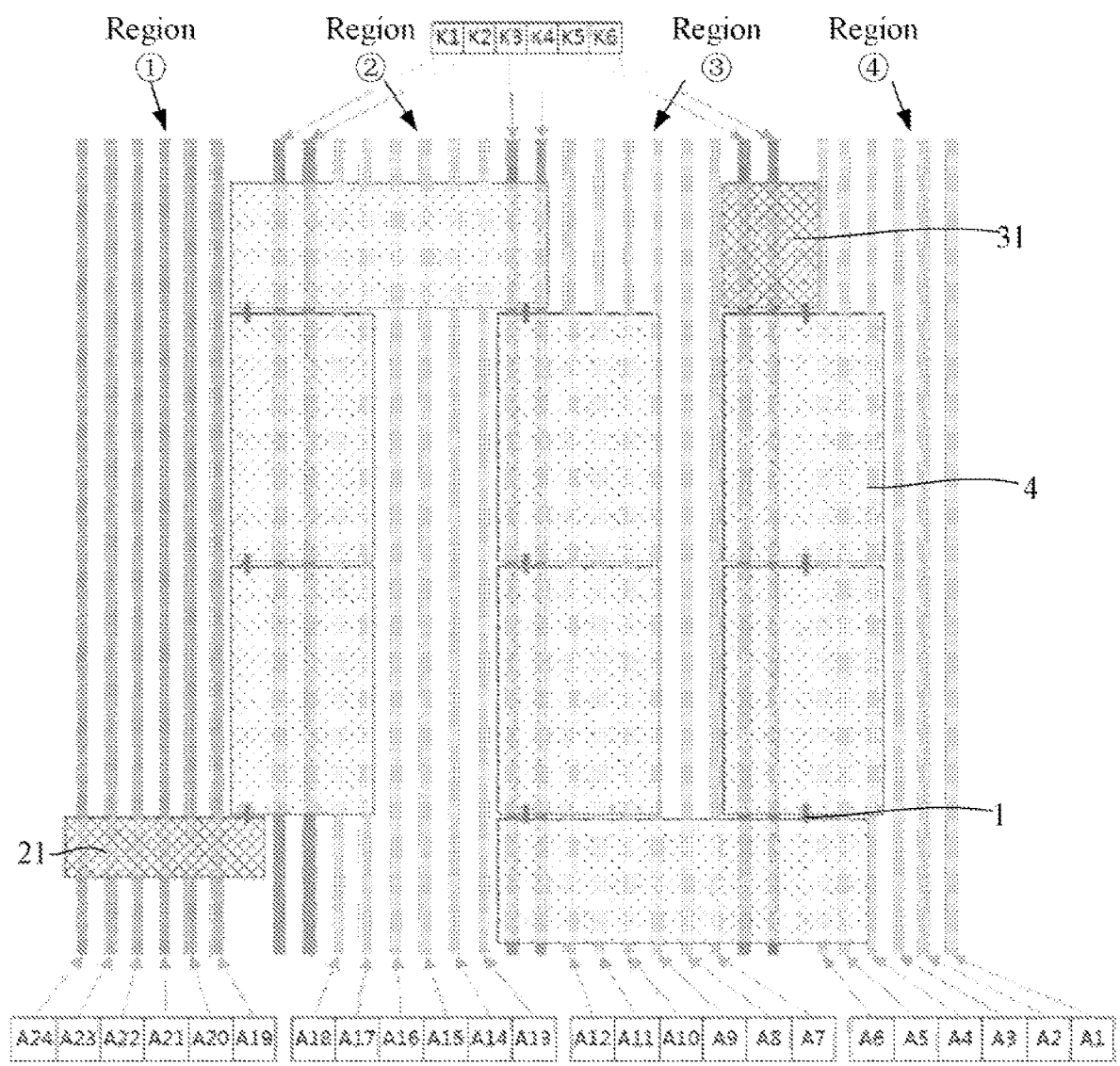
FIG. 6 is a partial enlarged view of a backlight module according to some exemplary embodiments of the present disclosure.

FIG. 5 is a schematic diagram of a plurality of regions of a base substrate included in a backlight module according to some exemplary embodiments of the present disclosure. FIG. 6 is a partial enlarged view of a backlight module according to some exemplary embodiments of the present disclosure. Referring to FIG. 4, FIG. 5 and FIG. 6 in combination, in the embodiments of the present disclosure, the backlight module includes: a base substrate SUB; a plurality of light zones 10 provided on the base substrate, wherein the plurality of light zones are arranged in an array on the base substrate, and each light zone includes a plurality of mini light emitting diodes 1, a plurality of lead wires 2 in the light zone, an external anode 3 and an external cathode 4, and the plurality of lead wires 2 in the light zone are used to electrically connect the plurality of mini light emitting diodes 1 in series; a plurality of anode wires A1 to A24 respectively electrically connected to external anodes of a plurality of rows of light zones; and a plurality of cathode wires K1 to K6 respectively electrically connected to external cathodes of the plurality of rows of light zones, wherein in at least some of the plurality of cathode wires, one same cathode wire is electrically connected to the external cathodes of the light zones located in different rows so as to provide, by means of time-division multiplexing, cathode signals to the light zones located in different rows; and same-wire light zones include a plurality of light zones electrically connected to one same cathode wire, same-type anode wires include a plurality of anode wires to which the same-wire light zones are connected, and orthographic projections of the same-type anode wires on the base substrate do not overlap with an orthographic projection of one same lead wire in the light zone on the base substrate.

Continuing to refer to FIG. 5 and FIG. 6, the plurality of cathode wires K1 to K6 are arranged at intervals, the base substrate includes a plurality of regions, and any two adjacent regions in the plurality of regions, for example, a region ①, a region ②, a region ③, and a region ④ as shown in FIG. 5 are spaced apart by an orthographic projection of at least one cathode wire on the base substrate.

In the embodiments of the present disclosure, orthographic projections of the same-type anode wires on the base substrate are located in different regions of the plurality of regions, respectively. For example, the same-type anode wires A1, A7, A13, and A19 are located in the region ④, the region ③, the region ②, and the region ①, respectively.

The plurality of anode wires A1 to A24 include a plurality of groups of anode wires, and orthographic projections of a plurality of anode wires in each group of anode wires on the base substrate fall within one same region of the plurality of regions. For example, in the embodiment shown in FIG. 6, four groups of anode wires are provided, which are a first group of anode wires A19 to A24, a second group of anode wires A13 to A18, a third group of anode wires A7 to A12, and a fourth group of anode wires A1 to A6. A plurality of light zones, to which each group of anode wires is connected, are respectively electrically connected to different cathode wires.

For example, the plurality of light zones are arranged in an array of m rows and n columns on the base substrate SUB. A number of the plurality of cathode wires is M, a number of the plurality of anode wires is m, a number of the plurality of groups of anode wires is N, wherein m, n, and M are positive integers greater than or equal to 2, m is more than 2 times of M, and N is a rounded up value obtained by dividing m by M.

A number of the plurality of regions is N, and the N groups of anode wires are respectively located in the N regions.

The N groups of anode wires at least include a first group of anode wires, a second group of anode wires, and a third group of anode wires, and the N regions at least include a first region, a second region and a third region. Orthographic projections of the first group of anode wires, the second group of anode wires and the third group of anode wires on the base substrate fall within a first region, a second region and a third region, respectively, and orthographic projections of the first group of anode wires on the base substrate do not overlap with an orthographic projection of a lead wire in the light zone on the base substrate.

Orthographic projections of the second group of anode wires on the base substrate overlap with orthographic projections of some of the plurality of lead wires in the light zone on the base substrate, and orthographic projections of the third group of anode wires on the base substrate overlap with orthographic projections of some others of the plurality of lead wires in the light zone on the base substrate.

Some of the plurality of lead wires in the light zone extend in a first direction, and some others of the plurality of lead wires in the light zone extend in a second direction, and the second direction intersects with the first direction.

The plurality of cathode wires are divided into N−1 groups, and the N−1 groups of cathode wires are arranged equidistantly on the base substrate at intervals.

Figure 7A:
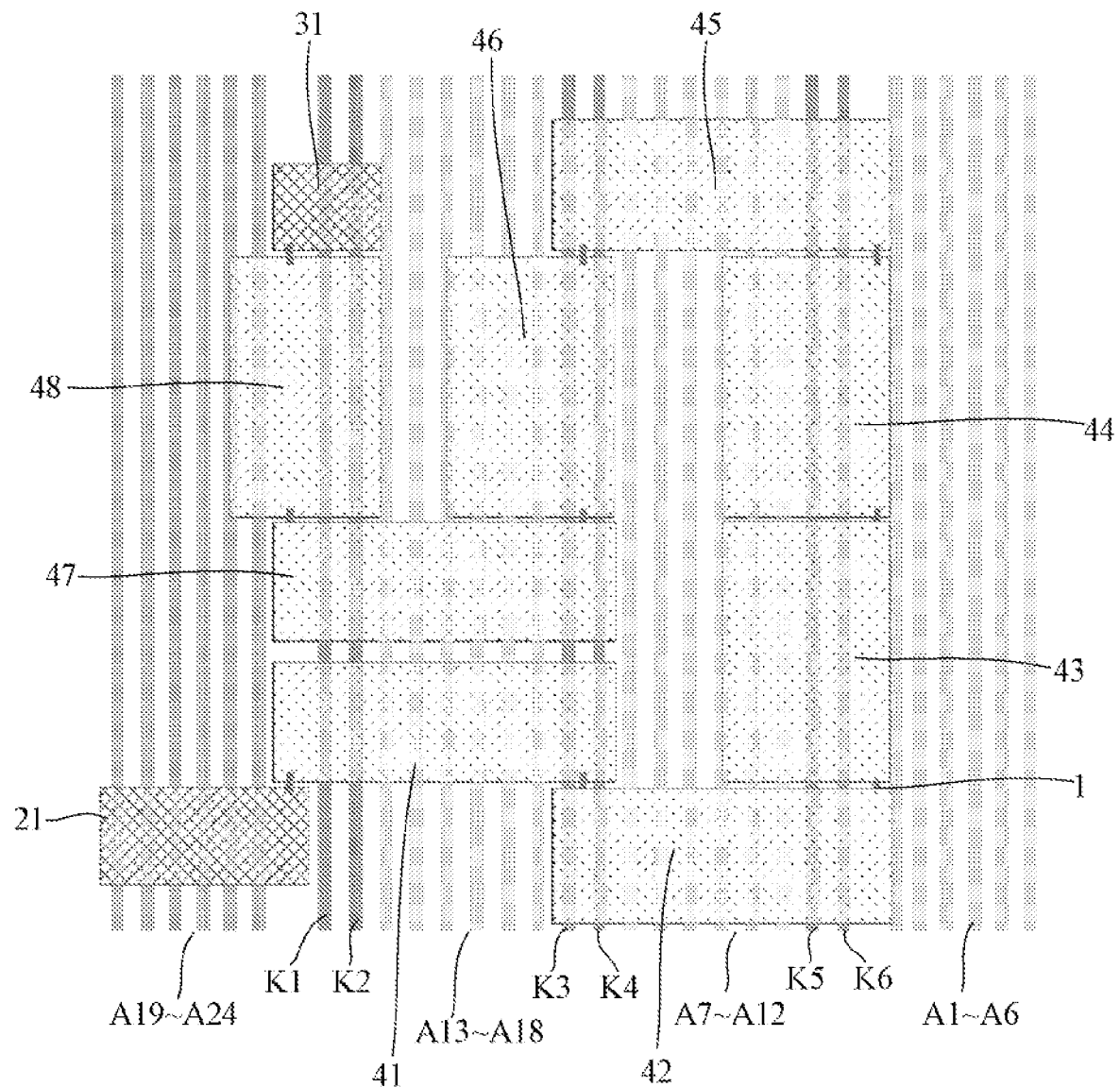
FIG. 7A, FIG. 7B, and FIG. 7C schematically show different implementations of anode wires, cathode wires, and lead wires in a light zone, respectively, wherein the anode wire falls into a first region.
Figure 7B:
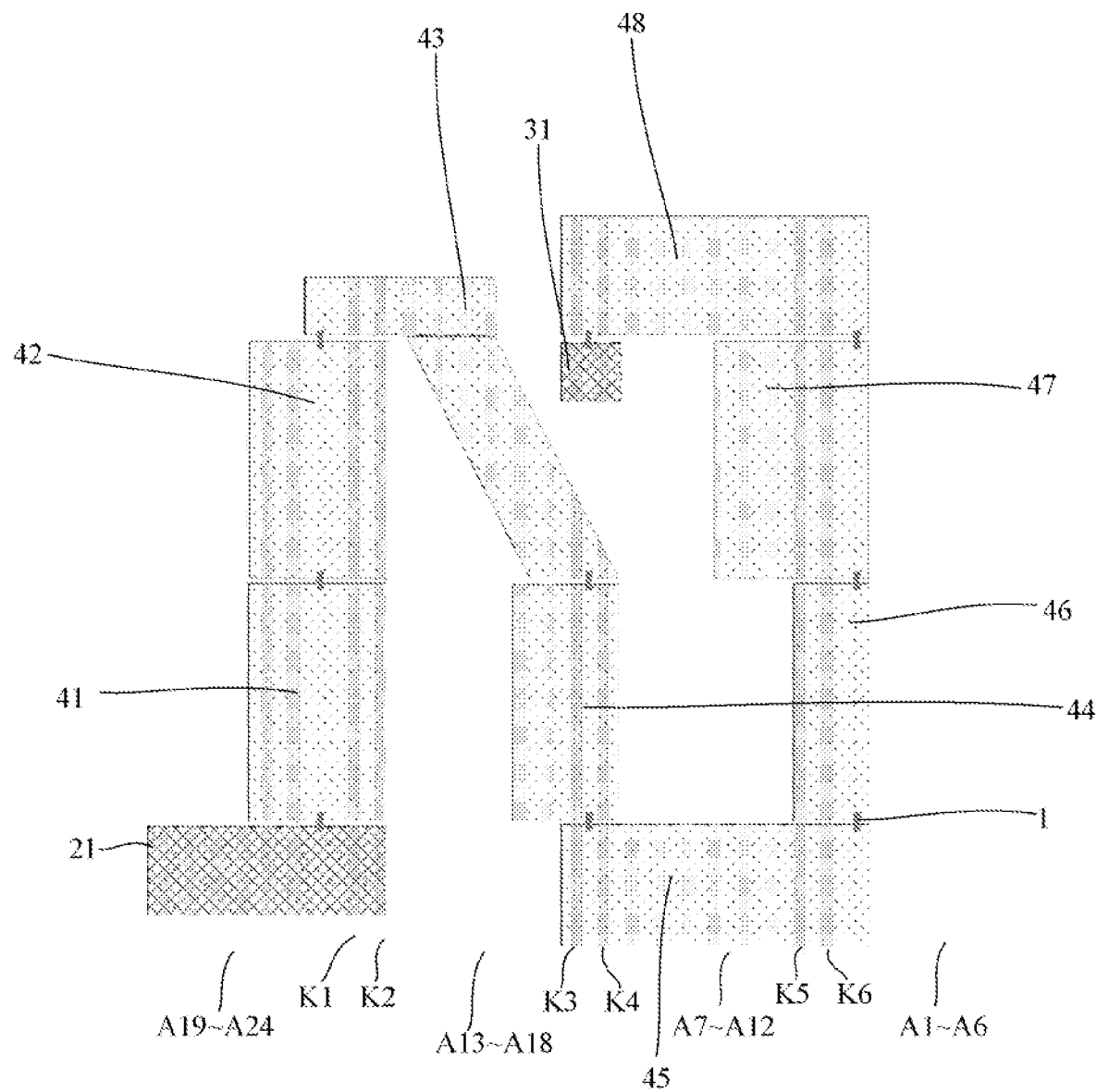
Figure 7C:
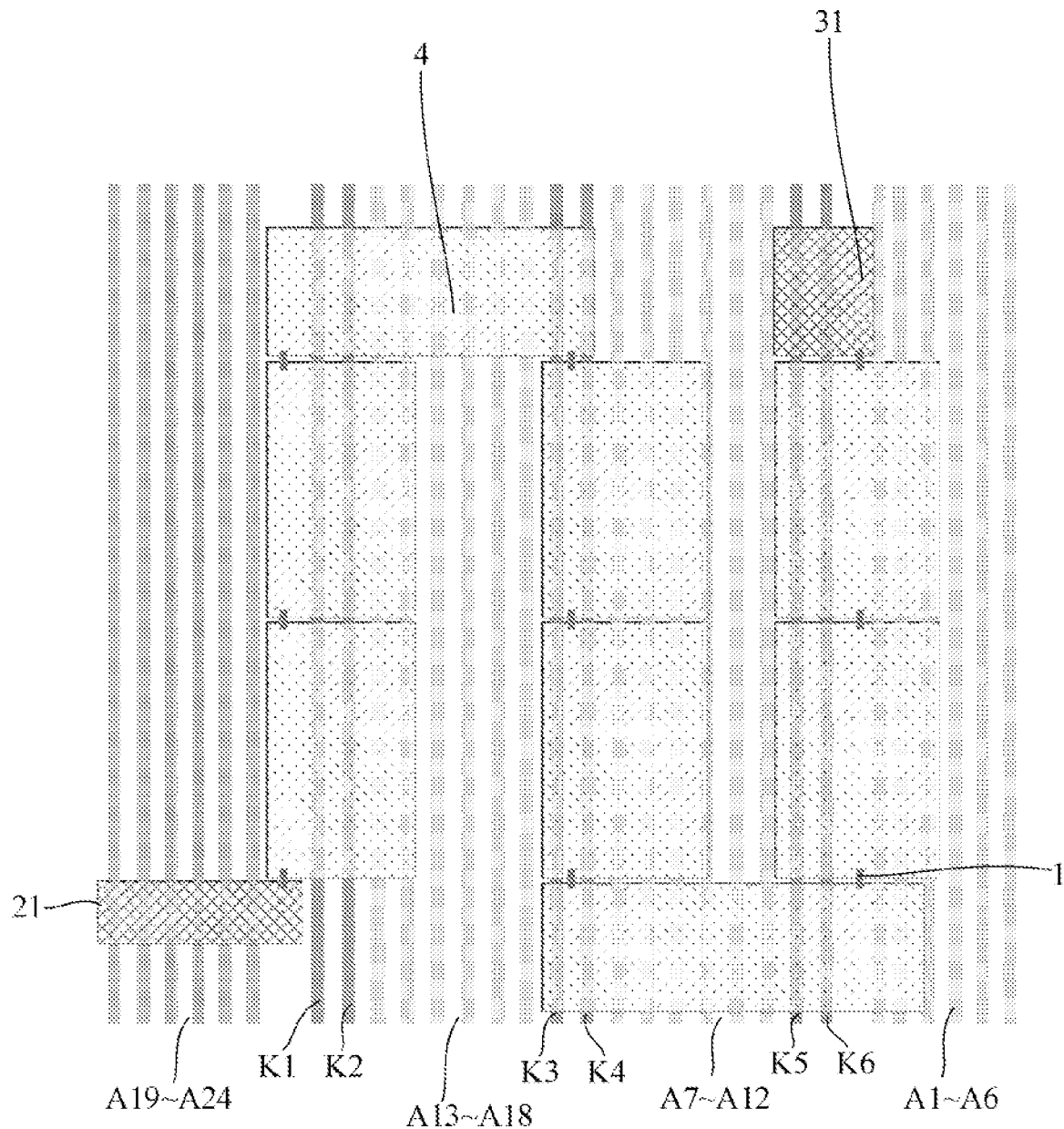

FIG. 7A, FIG. 7B, and FIG. 7C schematically show different implementations of anode wires, cathode wires, and lead wires in a light zone, respectively. The embodiments shown in FIG. 7A to FIG. 7C are directed to the light zone in which the anode wire falls into the first region.

Referring to FIG. 7A, for a light zone in which the anode wire falls into the first region, the cathode wire thereof may be located on the left side. For example, in one light zone 10, eight lead wires 4 in the light zone are provided to connect 9 mini LEDs 1 in series. Along a sequence of the series connection, the eight lead wires 4 in the light zone may be respectively referred as a first lead wire 41 in the light zone, a second lead wire 42 in the light zone, a third lead wire 43 in the light zone, a fourth lead wire 44 in light zone, a fifth lead wire 45 in the light zone, a sixth lead wire 46 in the light zone, a seventh lead wire 47 in the light zone, and an eighth lead wire 48 in the light zone. An anode wire 2 is electrically connected with an anode of a head mini LED 1 through a via hole in an anode connection region 21, and then electrically connected to a tail mini LED 1 through the first lead wire in the light zone, the second lead wire in the light zone, the third lead wire in the light zone, the fourth lead wire in the light zone, the fifth lead wire in the light zone, the sixth lead wire in the light zone, the seventh lead wire in the light zone and the eighth lead wire in the light zone, and the tail mini LED 1 is electrically connected with a cathode wire 3 through a via hole located in a cathode connection region 31.

Orthographic projections of the first group of anode wires on the base substrate partially overlap with an orthographic projection of the eighth lead wire 48 in the light zone on the base substrate. Orthographic projections of the second group of anode wires on the base substrate partially overlap with orthographic projections of the sixth lead wire 46 in the light zone and the seventh lead wire 47 in the light zone on the base substrate. Orthographic projections of the third group of anode wires on the base substrate partially overlap orthographic projections of the second lead wire 42 in the light zone, the third lead wire 43 in the light zone, the fourth lead wire 44 in the light zone and the fifth lead wire 45 in the light zone on the base substrate. Orthographic projections of the fourth group of anode wires on the base substrate do not overlap with orthographic projections of all the lead wires in the group on the base substrate. In this way, orthographic projections of the same-type anode wires (e.g., A1/A7/A13/A19) on the base substrate do not overlap with an orthographic projection of one same lead wire in the light zone on the base substrate.

As shown in FIG. 7A, some of the lead wires in the light zone (for example, the first lead wire 41 in the light zone, the second lead wire 42 in the light zone, the fifth lead wire 45 in the light zone and the seventh lead wire 47 in the light zone) extend along the first direction (e.g., the row direction), and some of the lead wires of the light zone (the third lead wire 43 in the light zone, the fourth lead wire 44 in light zone, the sixth lead wire 46 in the light zone and the eighth lead wire 48 in the light zone) extend in the second direction (e.g., the column direction). Through such extension, it may be ensured that orthographic projections of the same-type anode wires (e.g. A1/A7/A13/A19) on the base substrate do not overlap with the orthographic projection of one same lead wire in the same light zone on the base substrate.

Referring to FIG. 7B, for a light zone in which the anode wire falls into the first region, the cathode wire thereof may be located in the middle. The fourth lead wire 44 in the light zone extends in an oblique direction (relative to the row or column direction). By designing the lead wires in the light zone, it may be realized that orthographic projections of the same-type anode wires (e.g. A1/A7/A13/A19) on the base substrate do not overlap with an orthographic projection of one same lead wire in the light zone on the base substrate.

Referring to FIG. 7C, for a light zone in which the anode wire falls into the first region, the cathode wire thereof may be located on the right side.

Figure 8A:
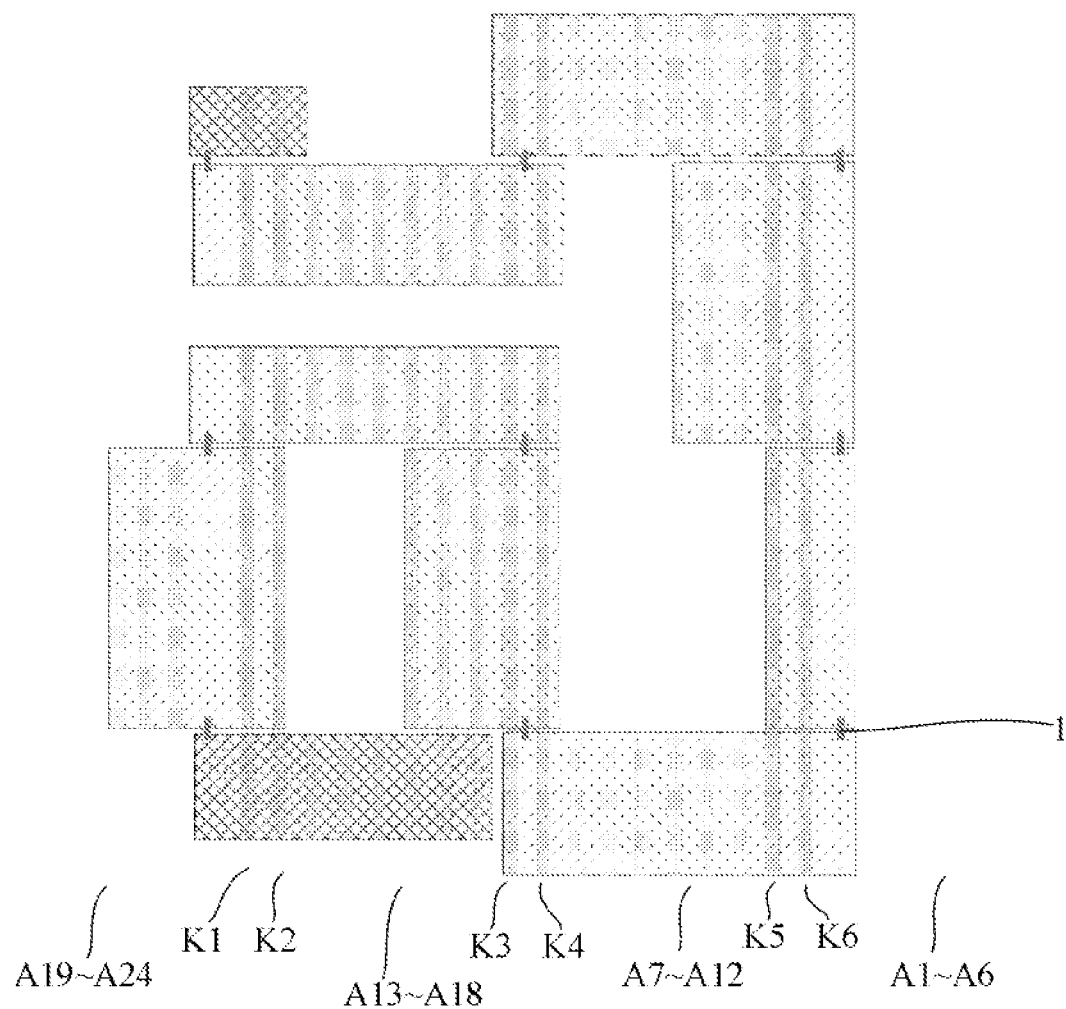
FIG. 8A, FIG. 8B, and FIG. 8C schematically show different implementations of anode wires, cathode wires, and lead wires in a light zone, respectively, wherein the anode wire falls into a second region.
Figure 8B:
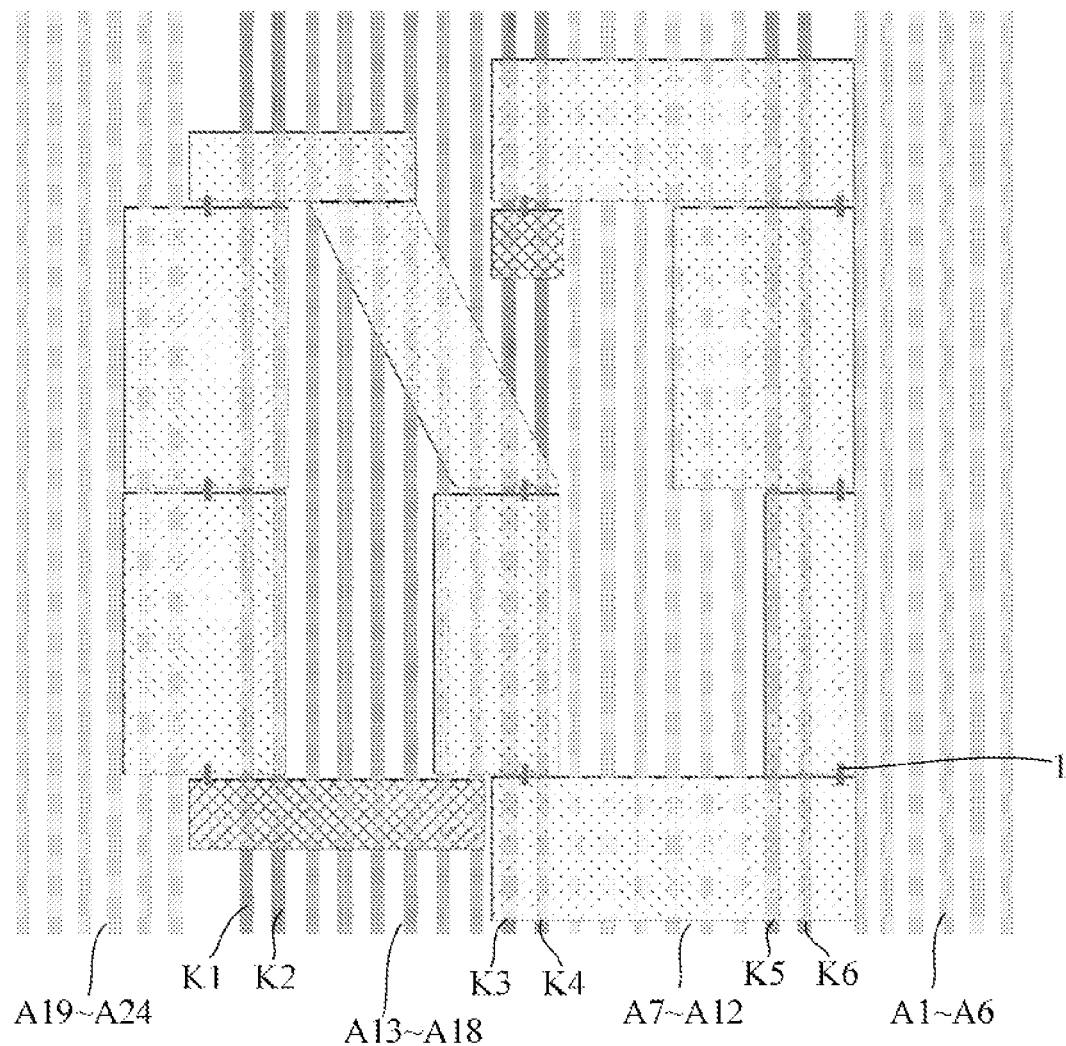
Figure 8C:
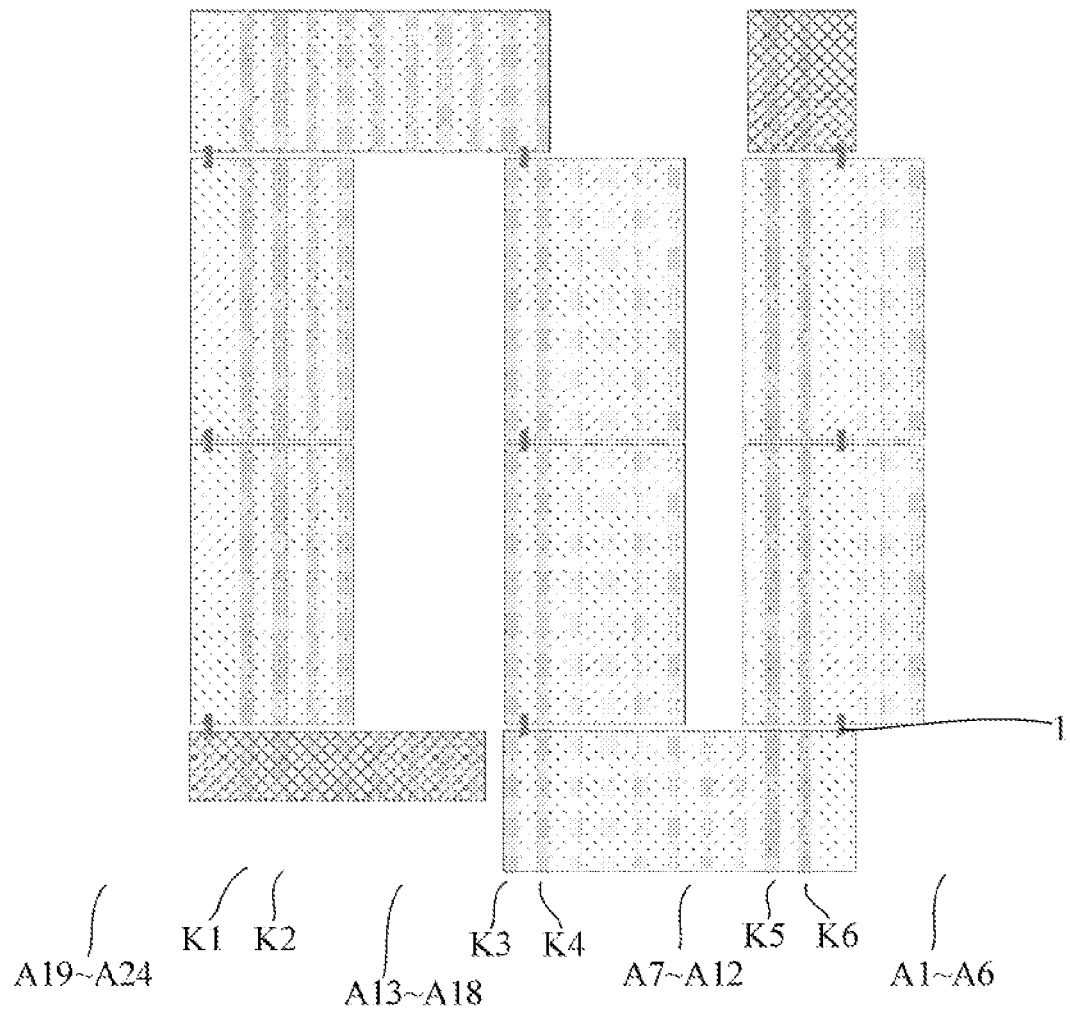

FIG. 8A, FIG. 8B, and FIG. 8C schematically show different implementations of anode wires, cathode wires, and lead wires in a light zone, respectively, The embodiments shown in FIG. 8A to FIG. 8C are directed to a light zone in which the anode wire falls into the second region. Referring to FIG. 8A, for the light zone in which the anode wire falls into the second region, the cathode wire thereof may be located on the left side. Referring to FIG. 8B, for the light zone in which the anode wire falls into the second region, the cathode wire thereof may be located in the middle. Referring to FIG. 8C, for the light zone in which the anode wire falls into the second region, the cathode wire thereof may be located on the right side.

Figure 9A:
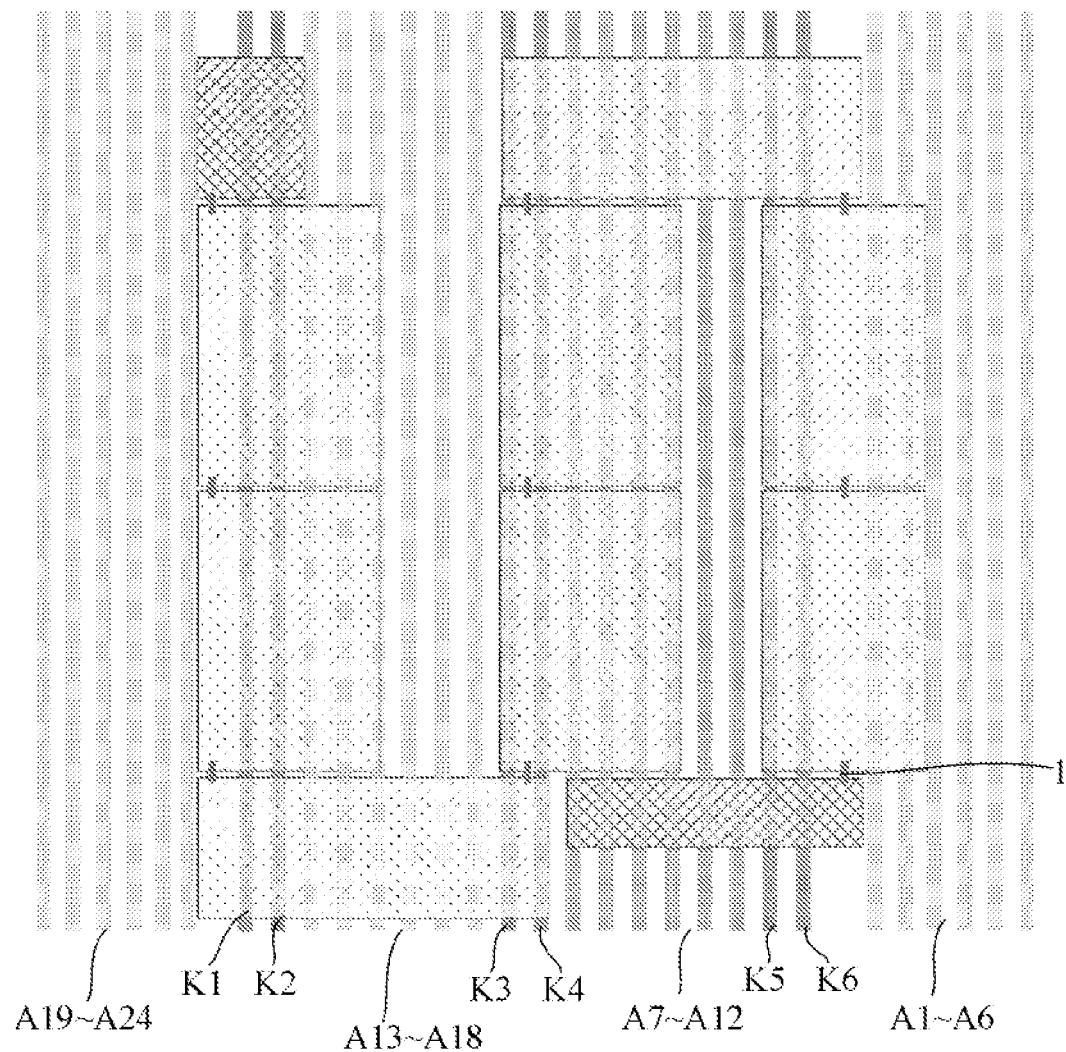
FIG. 9A, FIG. 9B, and FIG. 9C schematically show different implementations of anode wires, cathode wires, and lead wires in a light zone, respectively, wherein the anode wire falls into a third region.
Figure 9B:
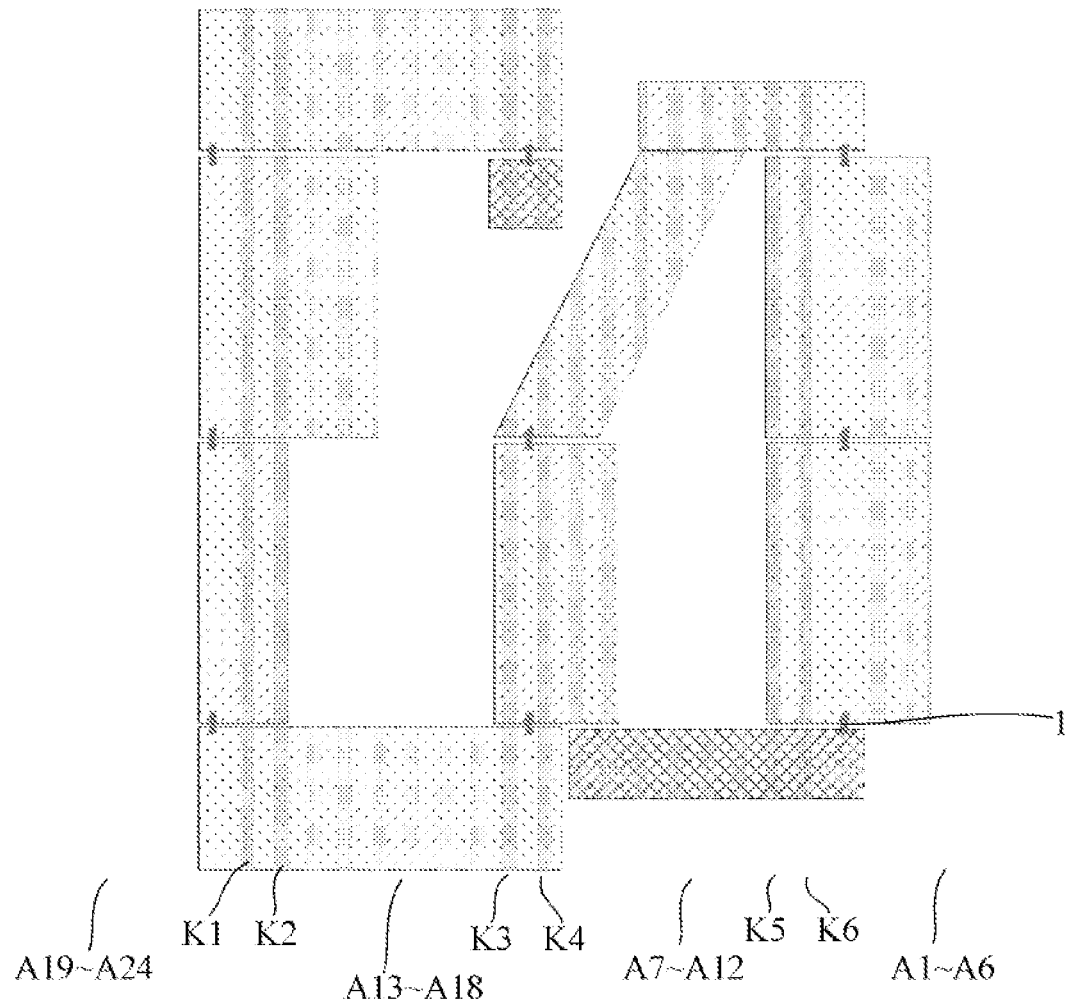
Figure 9C:
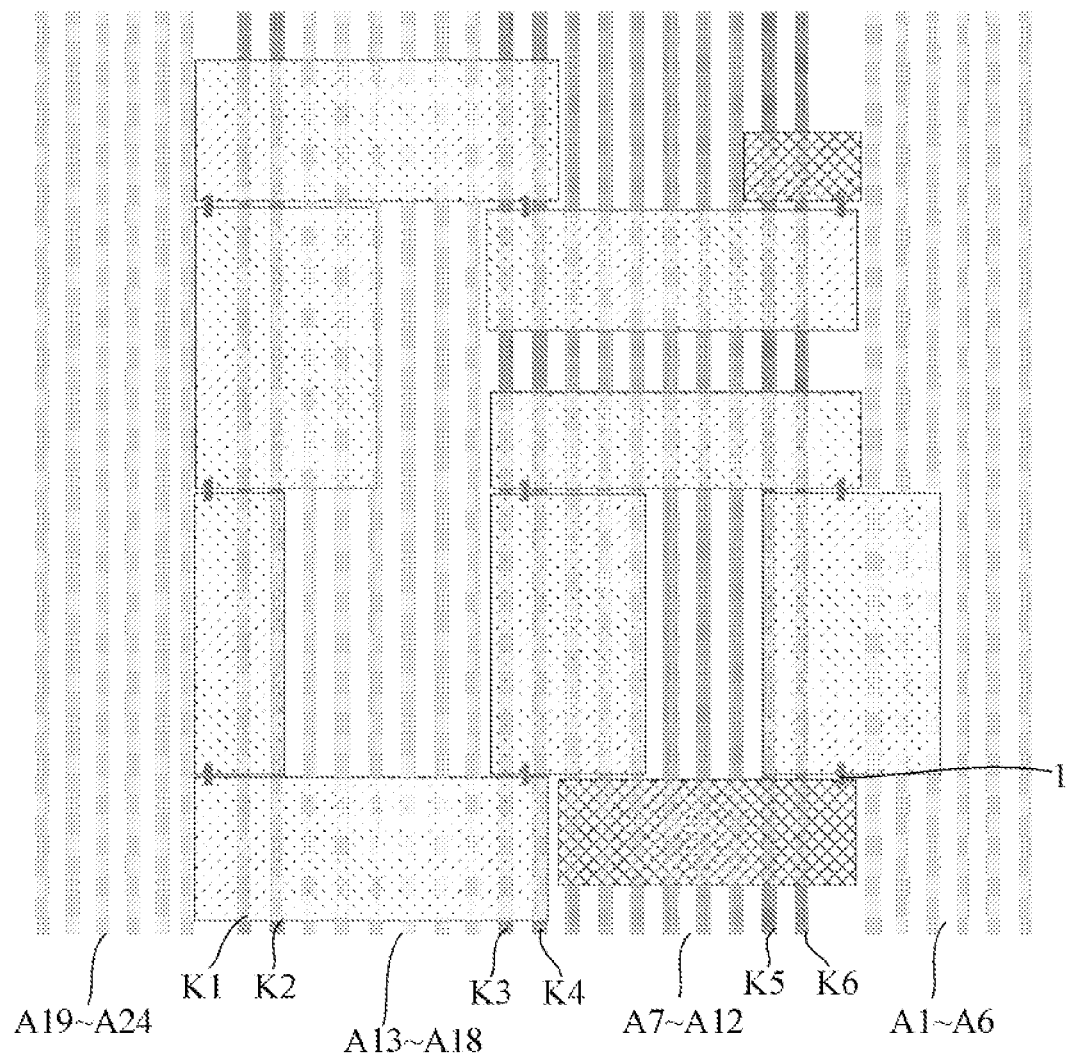

FIG. 9A, FIG. 9B, and FIG. 9C schematically show different implementations of anode wires, cathode wires, and lead wires in a light zone, respectively. The embodiments shown in FIG. 9A to FIG. 9C are directed to a light zone in which the anode wire falls into the third region.

Referring to FIG. 9A, for the light zone in which the anode wire falls into the third region, the cathode wire thereof may be located on the left side. Referring to FIG. 9B, for the light zone in which the anode wire falls into the third region, the cathode wire thereof may be located in the middle. Referring to FIG. 9C, for the light zone in which the anode wire falls into the third region, the cathode wire thereof may be located on the right side.

Figure 10A:
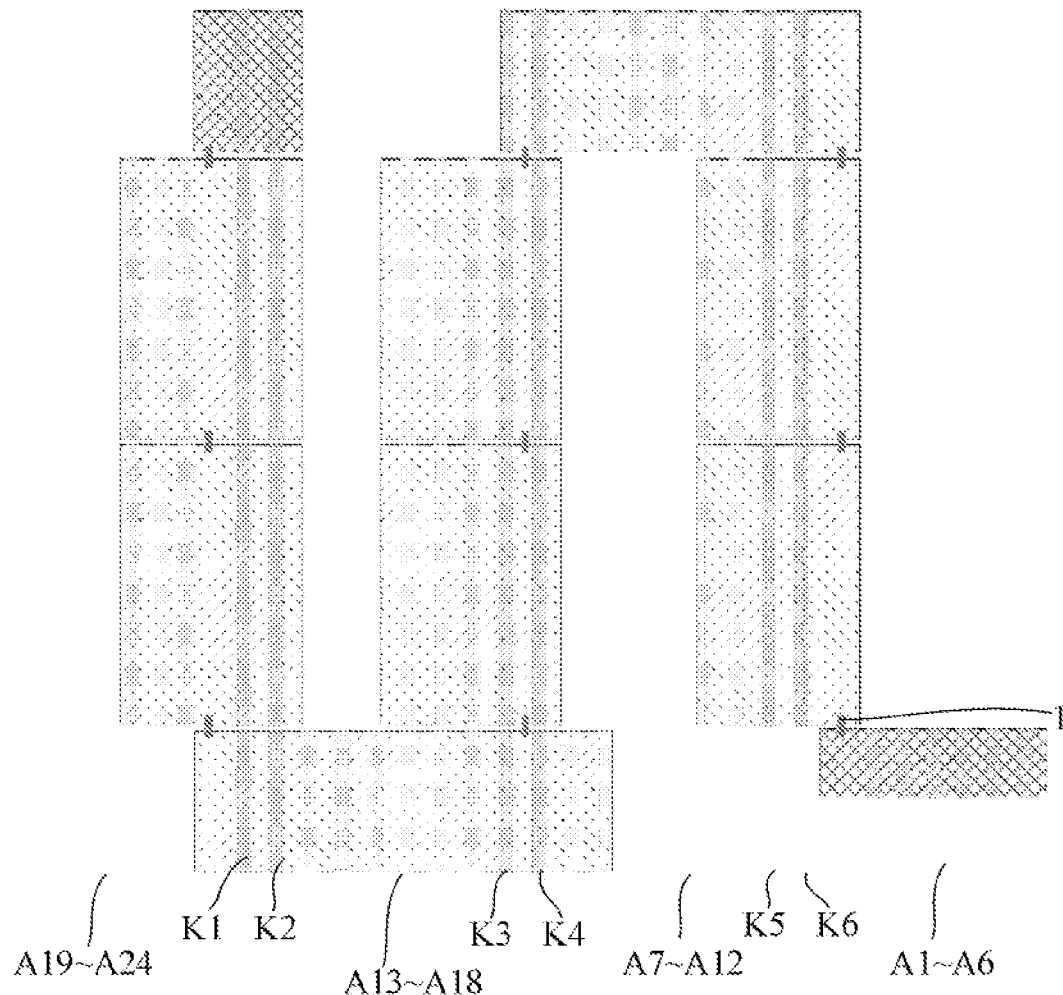
FIG. 10A, FIG. 10B, and FIG. 10C schematically show different implementations of anode wires, cathode wires, and lead wires in a light zone, respectively, wherein the anode wire falls into a third region.
Figure 10B:
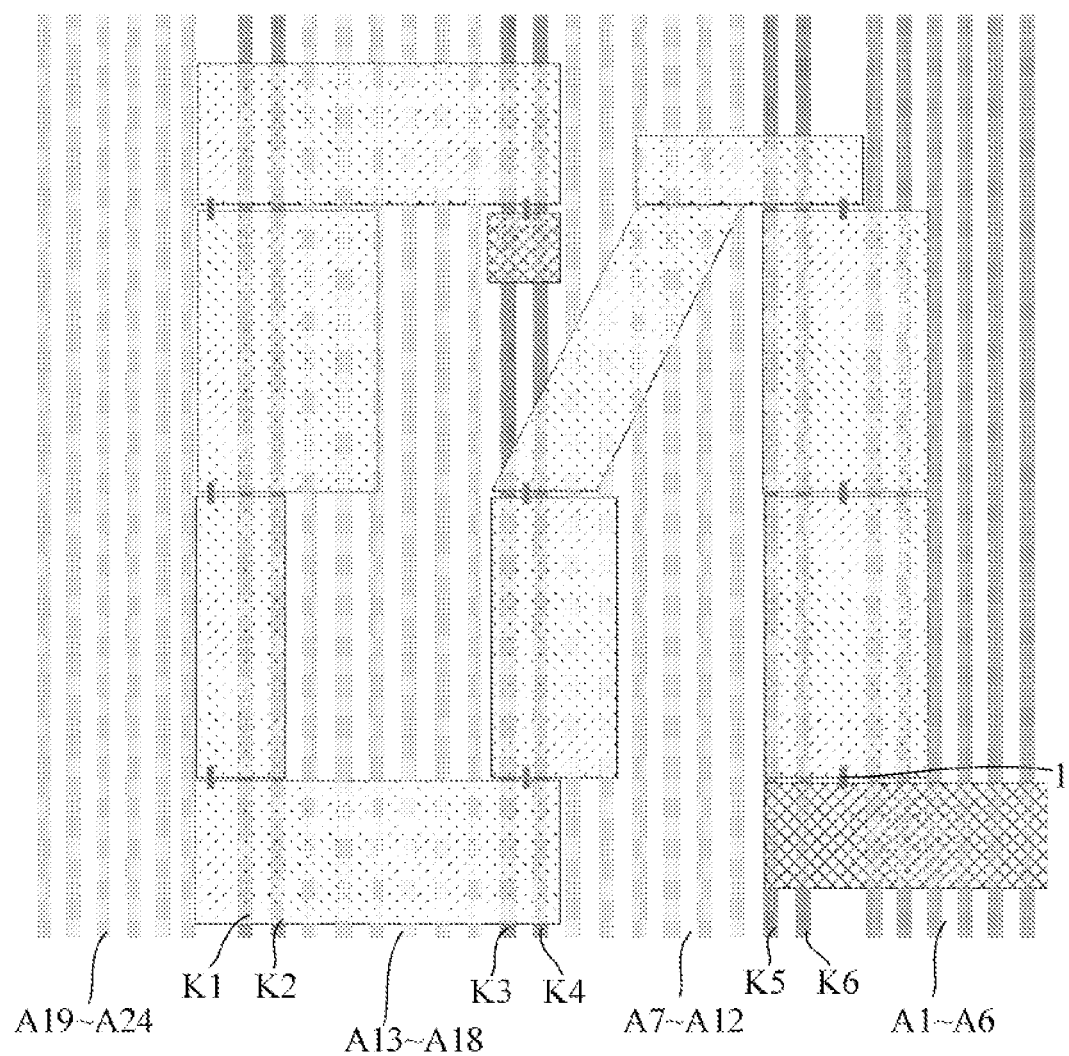
Figure 10C:
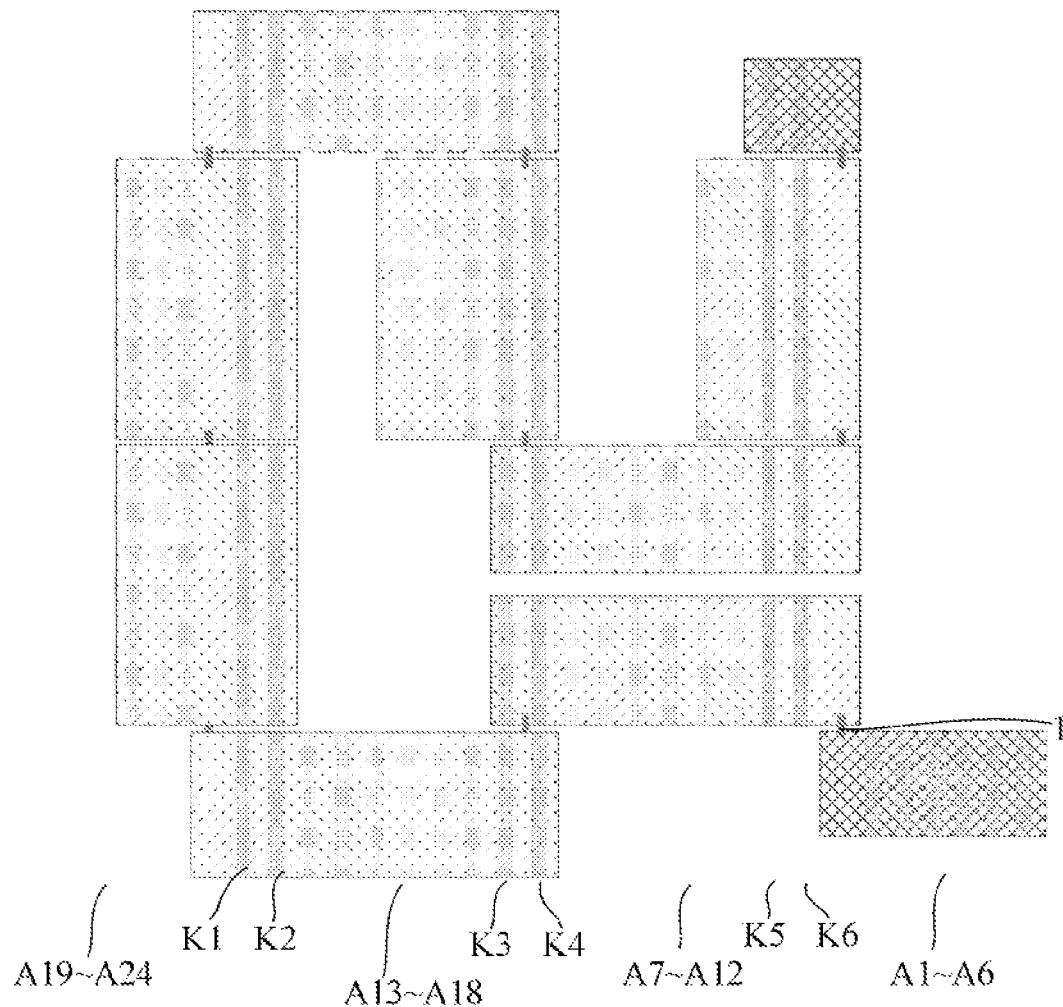

FIG. 10A, FIG. 10B, and FIG. 10C schematically show different implementations of anode wires, cathode wires, and lead wires in a light zone, respectively. The embodiments shown in FIG. 10A to FIG. 10C are directed to the light zone in which the anode wire falls into the fourth region. Referring to FIG. 10A, for the light zone in which the anode wire falls into the fourth region, the cathode wire thereof may be located on the left side. Referring to FIG. 10B, for the light zone in which the anode wire falls into the fourth region, the cathode wire thereof may be located in the middle. Referring to FIG. 10C, for the light zone in which the anode wire falls into the fourth region, the cathode wire thereof may be located on the right side.

The embodiments described above may refer to the descriptions of FIG. 7a to FIG. 7C, which will not be repeated here.

For example, both the anode wire and the cathode wire extend in the first direction.

For example, a width of each of the plurality of lead wires in the light zone is larger than a width of each of the plurality of anode wires and the plurality of cathode wires. In this way, it is beneficial to a heat dissipation of the mini LEDs.

Figure 11:
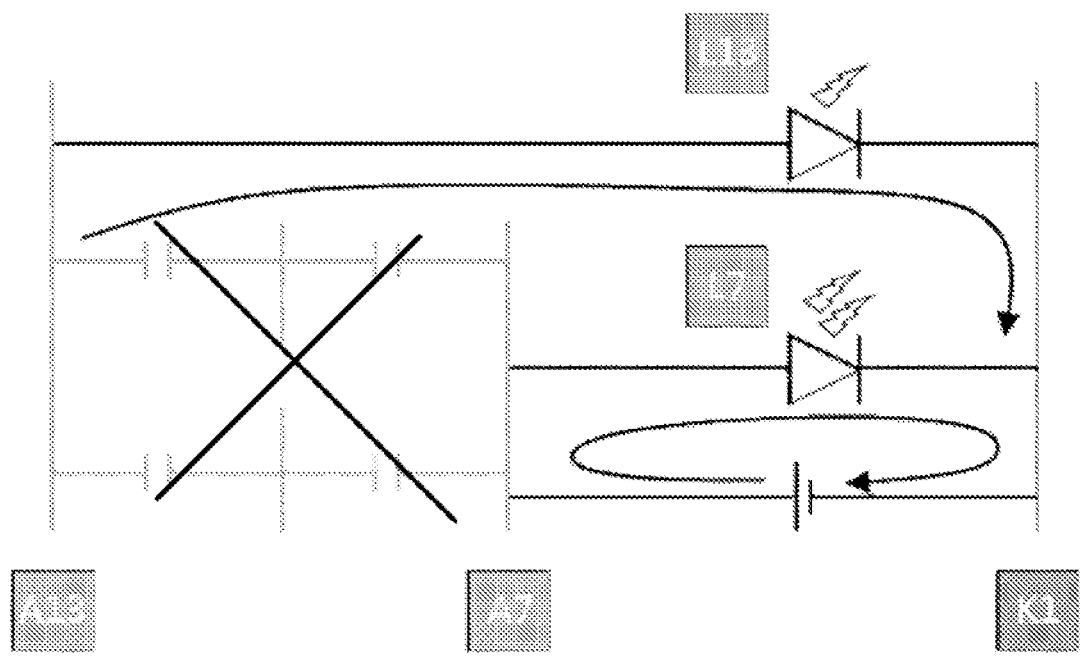
FIG. 11 schematically shows that no parasitic capacitance is formed between same-type anode wires.

In the embodiments of the present disclosure, the orthographic projections of the same-type anode wires (e.g., A1/A7/A13/A19) on the base substrate do not overlap with the orthographic projection of one same lead wire in the light zone on the base substrate. Therefore, parasitic capacitance is not formed between the same-type anode wires. As shown in FIG. 11, for the same-type anode wires A7 and A13 connected to the same cathode wire K1, since there is no parasitic capacitance between the anode wire A7 and the anode wire A13, a capacitance voltage caused by the parasitic capacitance is avoided. That is, a generation of a parasitic voltage in the anode wire A13 is avoided, and an abnormal lighting of the LED L13 may be avoided.

Figure 12:
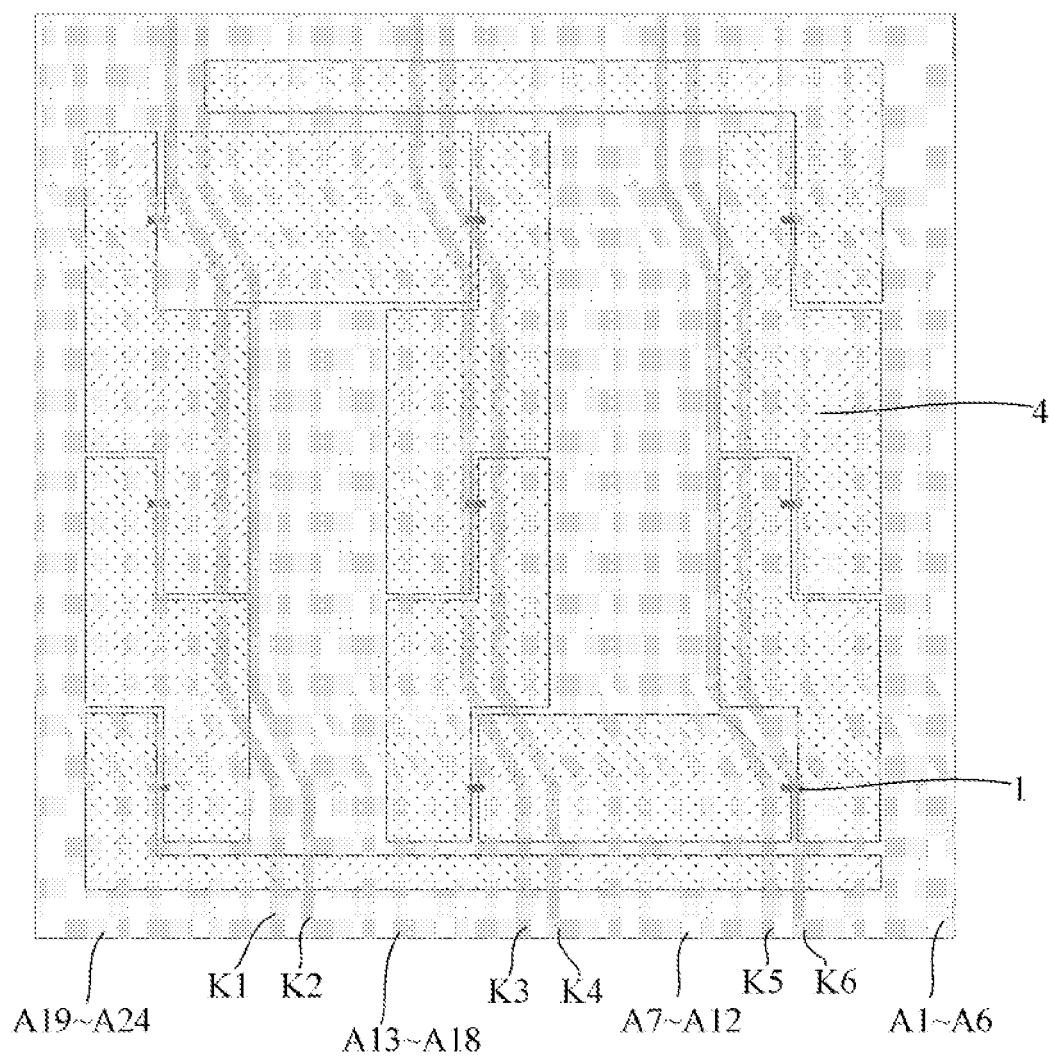
FIG. 12 is a partial enlarged view of a backlight module according to some exemplary embodiments of the present disclosure.

FIG. 12 is a partial enlarged view of a backlight module according to some exemplary embodiments of the present disclosure. In the embodiment shown in FIG. 12, orthographic projections of the same-type anode wires on the base substrate partially overlap with an orthographic projection of one same lead wire in the light zone on the base substrate, and the partial overlap enables a parasitic capacitance voltage generated on the same-type anode wires to be smaller than a threshold voltage of the light zone. That is, due to the partial overlap, a parasitic voltage may be generated between the same-type anode wires (e.g., between A7 and A13 in FIG. 11). However, since an overlapping area is small enough, the generated parasitic voltage is small, which is less than the threshold voltage of the light zone. In this way, an abnormal lighting of the LEDs may also be avoided.

In the embodiments of the present disclosure, the following driving timing may be employed.

The integrated circuit 7 is connected to the cathode wires K1 to K6 one by one, and non-connected cathode wires are in a high resistance state; at the same time, according to a pattern to be displayed/lightened, power is supplied to each of anode wires A1 to A24 sequentially. For example, a series of modulated square wave signals may be output in pWM mode to drive and lighten the LEDs.

The region where the light zones may be wired is divided into several groups. The same-type anode wires are respectively arranged in different regions. Taking a 31.2-inch Mini LED backlight product as an example, the light zone region may be divided into 4 (24/6) regions. Then, the plurality of light zones may be driven row by row without generating a parasitic voltage.

Some exemplary embodiments of the present disclosure further provide a display device.

The display device may be any product or component with a display function. For example, the display device may be a smart phone, a portable phone, a navigation device, a television (TV), a car audio body, a laptop computer, a tablet computer, a portable multimedia player (pMp), a personal digital assistant (pDA), etc.

It should be understood that the display device according to some exemplary embodiments of the present disclosure has all the features and advantages of the backlight module described above, which may be referred to the above descriptions of the light emitting substrate, and will not be repeated here.

As used herein, the terms "substantially", "about", "approximately", and other similar terms are used as terms of approximation rather than as terms of degree, and are intended to account for inherent deviations in measured or calculated values that would be recognized by those of ordinary skill in the art. Taking into account factors such as process fluctuations, measurement problems, errors associated with measurement of particular quantities (i.e., limitations of a measurement system), etc., "about" or "approximately" as used herein includes the stated values, and indicates that the particular values are within acceptable tolerances as determined by those of ordinary skill in the art. For example, "about" may mean within one or more standard deviations, or within ±10% or ±5% of the stated values.

Some embodiments of the general inventive concept of the present disclosure have been illustrated and described. However, those of ordinary skill in the art will appreciate that these embodiments may be changed without departing from the principles and spirit of the general inventive concept of the present disclosure. The scope of the present disclosure is defined by the claims and their equivalents.

What is claimed is:

1. A backlight module, comprising:
a base substrate;
a plurality of light zones arranged on the base substrate, wherein the plurality of light zones are arranged in an array on the base substrate, each light zone comprises a plurality of mini light emitting diodes, a plurality of lead wires in the light zone, an external anode and an external cathode, and the plurality of lead wires in the light zone are configured to electrically connect the plurality of mini light emitting diodes in series;
a plurality of anode wires respectively electrically connected to external anodes of a plurality of rows of light zones; and
a plurality of cathode wires respectively electrically connected to external cathodes of a plurality of rows of light zones,
wherein in at least some of the plurality of cathode wires, one same cathode wire is electrically connected to the external cathodes of the light zones located in different rows to provide, by means of time-division multiplexing, cathode signals to the light zones located in different rows; and
same-wire light zones comprise a plurality of light zones electrically connected to one same cathode wire, same-type anode wires comprise a plurality of anode wires to which the same-wire light zones are connected, and orthographic projections of the same-type anode wires on the base substrate do not overlap with an orthographic projection of one same lead wire in any of the plurality of light zones on the base substrate.

2. The backlight module according to claim 1, wherein the plurality of cathode wires are arranged at intervals, the base substrate comprises a plurality of regions, and any two adjacent regions in the plurality of regions are spaced apart by an orthographic projection of at least one cathode wire on the base substrate;

the orthographic projections of the same-type anode wires on the base substrate are located in different regions of the plurality of regions, respectively.

3. The backlight module according to claim 2, wherein the plurality of anode wires comprise a plurality of groups of anode wires, and orthographic projections of a plurality of anode wires in each group of anode wires on the base substrate fall within one same region of the plurality of regions;

a plurality of light zones to which each group of anode wires is connected are electrically connected to different cathode wires, respectively.

4. The backlight module according to claim 2, wherein the plurality of light zones are arranged in an array of m rows and n columns on the base substrate;

a number of the plurality of cathode wires is M, a number of the plurality of anode wires is m, a number of the plurality of groups of anode wires is N, wherein m, n, and M are positive integers greater than or equal to 2, m is more than 2 times of M, and N is a rounded up value obtained by dividing m by M.

5. The backlight module according to claim 4, wherein a number of the plurality of regions is N, and the N groups of anode wires are located in the N regions, respectively.

6. The backlight module according to claim 5, wherein the N groups of anode wires at least comprise a first group of anode wires, a second group of anode wires, and a third group of anode wires, and the N regions at least comprise a first region, a second region and a third region, orthographic projections of the first group of anode wires, the second group of anode wires and the third group of anode wires on the base substrate fall within the first region, the second region and the third region, respectively, and orthographic projections of the first group of anode wires on the base substrate do not overlap with orthographic projections of the lead wires in any of the plurality of light zones on the base substrate.

7. The backlight module according to claim 6, wherein orthographic projections of the second group of anode wires on the base substrate overlap with orthographic projections of some of the plurality of lead wires in the light zone on the base substrate, orthographic projections of the third group of anode wires on the base substrate overlap with orthographic projections of some others of the plurality of lead wires in the light zone on the base substrate.

8. The backlight module according to claim 4, wherein the anode wires and the cathode wires extend along a first direction, some of the plurality of lead wires in the light zone extend in the first direction, some others of the plurality of lead wires in the light zone extend in a second direction, and the second direction intersects with the first direction.

9. The backlight module according to claim 4, wherein the plurality of cathode wires are divided into N−1 groups, and the N−1 groups of cathode wires are arranged equidistantly on the base substrate at intervals.

10. The backlight module according to claim 8, wherein a width of each of the plurality of lead wires in the light zone is larger than a width of each of the plurality of anode wires and the plurality of cathode wires.

11. A backlight module, comprising:
a base substrate;
a plurality of light zones arranged on the base substrate, wherein the plurality of flight zones are arranged in an array on the base substrate, and each light zone comprises
a plurality of mini light emitting diodes,
a plurality of lead wires in the light zone,
an external anode and an external cathode, and the plurality of lead wires in the light zone are configured to electrically connect the plurality of mini light emitting diodes in series;
a plurality of anode wires respectively electrically connected to external anodes of a plurality of rows of light zones; and
a plurality of cathode wires respectively electrically connected to external cathodes of a plurality of rows of light zones,
wherein in at least some of the plurality of cathode wires, one same cathode wire is electrically connected to the external cathodes of light zones located in different rows to provide, by means of time-division multiplexing, cathode signals to the light zones located in different rows; and
same-wire light zones comprise a plurality of light zones electrically connected to one same cathode wire, same-type anode wires comprise a plurality of anode wires to which the same-wire light zones are connected, orthographic projections of the same-type anode wires on the base substrate partially overlap with an orthographic projection of one same lead wires in the light zone on the base substrate, and the partial overlap enables a parasitic capacitance voltage generated on the same-type anode wires to be smaller than a threshold voltage of the light zone.

12. A display device, comprising the backlight module according to claim 1.

* * * * *